US012230574B2

(12) United States Patent
Singh et al.

(10) Patent No.: US 12,230,574 B2
(45) Date of Patent: *Feb. 18, 2025

(54) REDUCING RC DELAY IN SEMICONDUCTOR DEVICES

(71) Applicant: Taiwan Semiconductor Manufacturing Co., Ltd., Hsinchu (TW)

(72) Inventors: Gulbagh Singh, Tainan (TW); Kun-Tsang Chuang, Miaoli (TW); Po-Jen Wang, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/361,560

(22) Filed: Jul. 28, 2023

(65) Prior Publication Data

US 2023/0378071 A1  Nov. 23, 2023

Related U.S. Application Data

(60) Continuation of application No. 17/745,509, filed on May 16, 2022, now Pat. No. 11,804,439, which is a (Continued)

(51) Int. Cl.
  *H01L 23/535* (2006.01)
  *H01L 21/74* (2006.01)
  (Continued)

(52) U.S. Cl.
  CPC .......... *H01L 23/535* (2013.01); *H01L 21/743* (2013.01); *H01L 21/76802* (2013.01);
  (Continued)

(58) Field of Classification Search
  CPC ................. H01L 23/535; H01L 21/743; H01L 21/76802; H01L 21/7682; H01L 23/5226;
  (Continued)

(56) References Cited

U.S. PATENT DOCUMENTS 8,232,618 B2   7/2012  Breyta et al.
9,105,490 B2   8/2015  Wang et al.
(Continued)

FOREIGN PATENT DOCUMENTS

CN   108231664 A    6/2018
CN   110416157 A   11/2019
(Continued)

OTHER PUBLICATIONS

Korean Application No. KR20200088746, Office Action mailed Apr. 19, 2022 with attached English language translation from EPO Global Dossier, 4 pages.

*Primary Examiner* — Patricia D Valenzuela
(74) *Attorney, Agent, or Firm* — Sterne, Kessler, Goldstein & Fox P.L.L.C.

(57) ABSTRACT

The present disclosure describes a method for reducing RC delay in radio frequency operated devices or devices that would benefit from an RC delay reduction. The method includes forming, on a substrate, a transistor structure having source/drain regions and a gate structure; depositing a first dielectric layer on the substrate to embed the transistor structure; forming, within the first dielectric layer, source/drain contacts on the source/drain regions of the transistor structure; depositing a second dielectric layer on the first dielectric layer; forming metal lines in the second dielectric layer; forming an opening in the second dielectric layer between the metal lines to expose the first dielectric layer; etching, through the opening, the second dielectric layer between the metal lines and the first dielectric layer between the source/drain contacts; and depositing a third dielectric
(Continued)

layer to form an air-gap in the first and second dielectric layers and over the transistor structure.

20 Claims, 17 Drawing Sheets

Related U.S. Application Data division of application No. 16/849,709, filed on Apr. 15, 2020, now Pat. No. 11,335,638.

(51) Int. Cl.
| | |
|---|---|
| *H01L 21/768* | (2006.01) |
| *H01L 23/522* | (2006.01) |
| *H01L 23/532* | (2006.01) |
| *H01L 23/482* | (2006.01) |
| *H01L 23/485* | (2006.01) |
| *H01L 27/12* | (2006.01) |

(52) U.S. Cl.
CPC ...... *H01L 21/7682* (2013.01); *H01L 23/5226* (2013.01); *H01L 23/5329* (2013.01); *H01L 23/4821* (2013.01); *H01L 23/485* (2013.01); *H01L 23/5222* (2013.01); *H01L 23/5223* (2013.01); *H01L 23/53223* (2013.01); *H01L 23/53238* (2013.01); *H01L 23/53295* (2013.01); *H01L 27/1203* (2013.01)

(58) Field of Classification Search
CPC ............. H01L 23/5329; H01L 23/4821; H01L 23/5222; H01L 23/5223; H01L 23/53223; H01L 23/53295; H01L 27/1203; H01L 23/485; H01L 27/088; H01L 21/823431; H01L 21/823475; H01L 27/0886; H01L 21/76816; H01L 21/76831; H01L 21/76897; H01L 23/53238

See application file for complete search history.

(56) References Cited

U.S. PATENT DOCUMENTS

| | | | |
|---|---|---|---|
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 10,157,778 | B2 | 12/2018 | Tsai et al. |
| 10,211,146 | B2 | 2/2019 | He et al. |
| 11,804,439 | B2 * | 10/2023 | Singh ................ H01L 21/76802 |
| 2009/0093112 | A1 | 4/2009 | Al-Bayati et al. |
| 2014/0151812 | A1 | 6/2014 | Liaw |
| 2016/0093566 | A1 | 3/2016 | Ting et al. |
| 2016/0141240 | A1 | 5/2016 | Saka et al. |
| 2017/0330790 | A1 | 11/2017 | He et al. |
| 2017/0330832 | A1 * | 11/2017 | He ..................... H01L 27/1203 |
| 2018/0005876 | A1 | 1/2018 | Tung et al. |
| 2018/0047617 | A1 | 2/2018 | Cheng et al. |
| 2018/0166553 | A1 | 6/2018 | Lee et al. |
| 2019/0074364 | A1 | 3/2019 | Schutz et al. |
| 2019/0334008 | A1 | 10/2019 | Chen et al. |
| 2020/0020567 | A1 | 1/2020 | Sun et al. |
| 2021/0050355 | A1 | 2/2021 | Su |
| 2021/0320030 | A1 | 10/2021 | Hsueh |

FOREIGN PATENT DOCUMENTS

| | | |
|---|---|---|
| CN | 110729233 A | 1/2020 |
| DE | 10 2016 114 912 A1 | 11/2017 |
| DE | 10 2017 207 777 A1 | 11/2017 |
| KR | 20190134203 A | 12/2019 |
| TW | 201801278 A | 1/2018 |

* cited by examiner

REDUCING RC DELAY IN SEMICONDUCTOR DEVICES

CROSS-REFERENCE TO RELATED APPLICATION

This application is a continuation of U.S. Non-Provisional patent application Ser. No. 17/745,509, filed on May 16, 2022, titled "Reducing RC Delay in Semiconductor Devices," which is a divisional of U.S. Non-Provisional patent application Ser. No. 16/849,709, filed on Apr. 15, 2020, titled "Reducing RC Delay in Semiconductor Devices," both of which are incorporated by reference herein in their entireties.

BACKGROUND

Active devices (e.g., transistors) in both logic and memory chips are electrically connected to each other and other areas of the chip with metal wiring. The wires in metal wiring are separated from each other with non-conducting (e.g., electrically insulating) dielectric layers. In both logic and memory, the role of the metal wiring is to transmit signals from one area of the chip to another. Increasing signal transmission speed, while minimizing signal losses, is critical for device scaling.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1A:
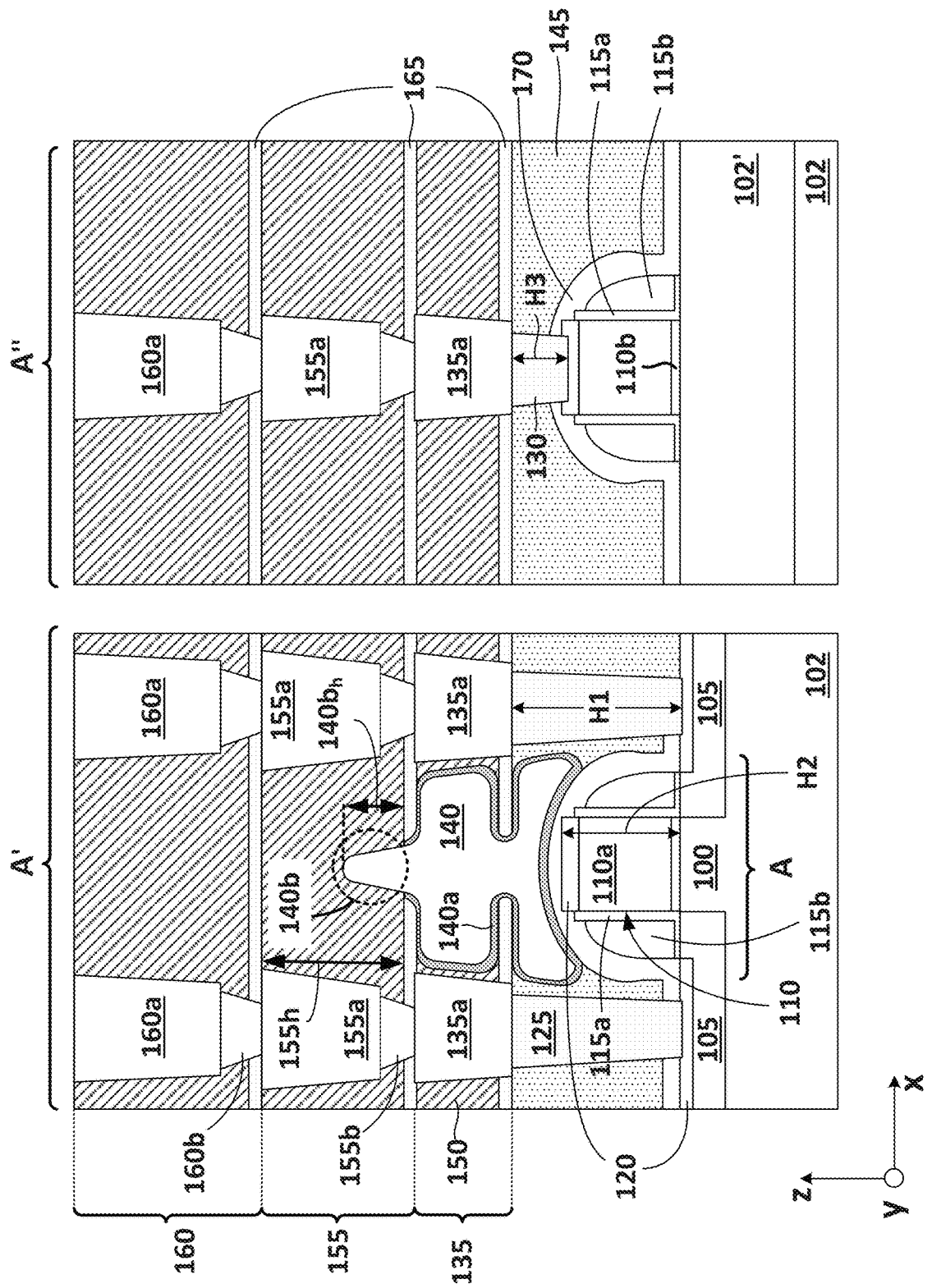
FIG. 1A is a cross-sectional view of local contacts with reduced height and air-gaps formed over transistor structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. It is to be understood that the terms "about" and "substantially" can refer to a percentage of the values as interpreted by those skilled in relevant art(s) in light of the teachings herein.

The term "vertical," as used herein, means nominally perpendicular to the surface of a substrate.

The speed of signal propagation in logic and memory wires is governed by the product of resistance and capacitance, commonly referred to as "RC delay". Lowering both resistance and capacitance would be ideal to achieve fast signal propagation within the chip. Devices operating at radio frequency (RF), such as RF switches and Low Noise Amplifiers (LNA), are particularly susceptible to RC delay—which is exacerbated by device scaling. For example, RF switching devices can exhibit poor RC performance due to the contribution of the back-end (BE) resistance and capacitance. This is because parasitic capacitance in BE can result in poor isolation during operation, while wire resistance can result in high insertion loss (e.g., input/output signal loss) and poor operating speeds.

The embodiments described herein are directed to a method for reducing the RC delay in RF devices or other devices that would benefit from an RC delay reduction. In some embodiments, the method includes forming local interconnects with reduced height and introducing air-gaps between the contacts in the local interconnects and the BE metallization layers (also referred to herein as "interconnect layers") to address RC delays. The embodiments described herein can be implemented globally (e.g., applied to all the areas of the chip) or selectively (e.g., applied on selective areas of the chip). By way of example and not limitation, the air-gap formed at the transistor level (e.g., between the contacts of the local interconnects) occupies between about 30% and about 70% of the available volume and the air-gap formed above the transistor level (e.g., within the first metallization layer in BE) occupies between about 40% and about 90% of the available volume. It is noted that the above-noted ranges are not limiting and values outside these ranges are within the spirit and the scope of this disclosure. In some embodiments, air-gaps are formed at the transistor level, above the transistor level, in both locations, and/or other applicable locations. In further embodiments, the source/drain contacts are taller than the height of the transistor's gate structure. In some embodiments, the source/drain contacts are about 2.5 times the height of the transistor's gate structure including any intervening silicide layers. Additional height ratios for the source/drain contacts and the transistor's gate are within the spirit and scope of this disclosure. In some embodiments, the height of the gate contact is reduced to improve the contact resistance. In some embodiments, the combination of contact height reduction in local interconnects and the presence of air-gaps achieves optimum RC delay reduction in the circuit.

According to some embodiments, FIG. 1A is a partial cross-sectional view of an exemplary transistor structure A formed in a first chip area A'. In some embodiments, transistor structure A is formed on a portion of substrate 102. By way of example and not limitation, transistor structure A can be a planar transistors structure or a non-planar transistor structure, such as a finFET formed on fin structures of substrate 102. By way of example and not limitation, transistor structure A includes a channel region 100, source/drain regions 105, a gate structure 110, and spacers 115a and 115b. In some embodiments, gate structure 110 and spacers 115a and 115b from transistor structure A extend in a second chip area A" on a dielectric layer 102' disposed on substrate 102 as shown in FIG. 1A and in FIG. 1B, which is an exemplary layout view of chip areas A' and A". In some embodiments, gate structure 110 further includes gate electrode 110a and gate dielectric stack 110b. Additional transistor structures, like transistor structure A, may be formed in other areas of the chip. These additional transistor structures are not shown in FIG. 1A for simplicity. By way of example and not limitation, transistor structure A can be part of an RF circuit, such as an RF switching circuit or LNA circuit. Alternatively, transistor structure A can be part of a DC circuit whose operation can be impacted by RC delays.

According to some embodiments, if gate structure 110 includes polysilicon, a silicide layer 120 is formed on each source/drain region 105 and gate structure 110 to reduce the contact resistance between source/drain contacts 125 and source/drain regions 105 in first chip area A' and between gate contact 130 and gate structures 110 in second chip area A". Source/drain contacts 125 in first chip area A' and gate contact 130 in second chip area A" form a network of contact structures collectively referred to herein as local interconnects.

In some embodiments, silicide layer 120 formed on gate structure 110 is in direct contact with gate electrode 110a if gate electrode 110a includes polysilicon. In some embodiments, if gate electrode 110a includes a metallic stack, silicide layer 120 is omitted and gate dielectric stack 110b includes a high-k dielectric material—e.g., a dielectric material with a dielectric constant (k-value) greater than about 3.9.

In some embodiments, the contacts of local interconnects, like source/drain contacts 125 and gate contacts 130, are shortened (e.g., reduced in height, for example, in the z-direction) to reduce the contact resistance—e.g., to reduce the resistance component of the RC delay. For example, heights H1 and H3 of respective source/drain contacts 125 and gate contacts 130 have been shortened with respect to their original heights. According to some embodiments, height H1 of source/drain contacts 125 is greater than height H2 and equal to or less than about 2.5 times height H2 (e.g., 1<H1/H2≤2.5)—where H2, as described herein, is defined as the height of gate structure 110 including the thickness of silicide layer 120 on gate structure 110. Respectively, height H3 is now equal to or greater than about 0.25 times height H2 and equal to or less than about 1.5 times height H2 (e.g., 0.25<H3/H2≤1.5). Heights H1 and H3 of source/drain contacts 125 and gate contacts 130 are measured respectively from the bottom surface of the contact to the top surface of the contact as shown in FIG. 1A.

Since source/drain contacts 125 and gate contacts 130 are now shorter, first metallization layer 135 is formed closer to transistor structure A. This in turn increases the parasitic capacitance formed between metal line 135a and gate structure 110, which impacts the RC delay of the circuit. In some embodiments, to compensate for the subsequent increase in the parasitic capacitance, an air-gap 140 is formed through interlayer dielectric (ILD) 145 and inter-metal dielectric (IVD) 150 over gate structure 110 of transistor structure A within fist chip area A'. In some embodiments, ILD 145 is formed around gate structure 110 of transistor structure A and the local interconnects (e.g., source/drain contacts 125 and gate contact 130) as means of electrical isolation. Respectively, IVD 150 is formed as means of electrical isolation between metal lines 135a of first metallization layer 135. Due to the formation process of air-gap 140 and the deposition characteristics of IMD 150, air-gap 140 may extend to IMD 150 of second metallization layer 155, which includes metal lines 155a and metal vertical interconnect access lines ("vias") 155b. The metallization layers, such as first and second metallization layers 135 and 155, are also collectively referred to herein as global interconnects, global interconnect layers, or interconnect layers. In some embodiments, air-gap 140 does not extend into second chip area A". Therefore, there is not overlap between air-gap 140 and gate contact 130.

Figure 1B:
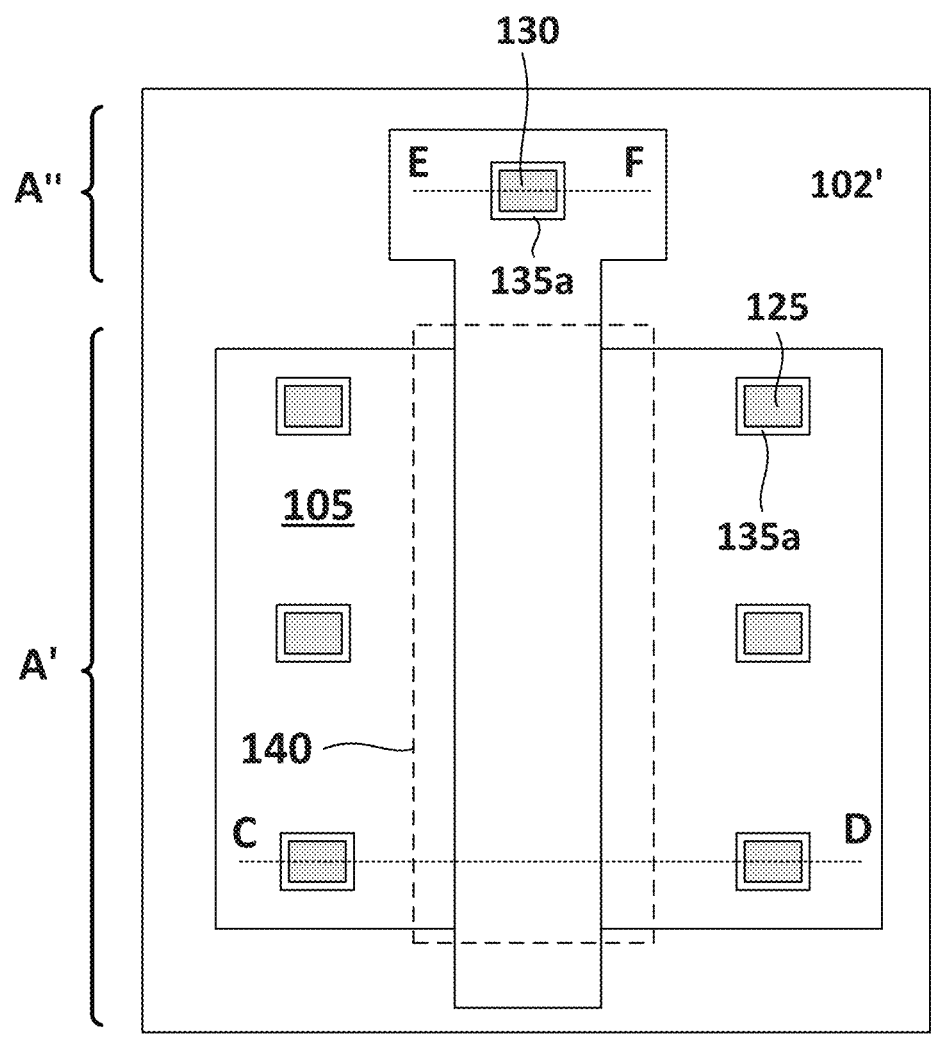
FIG. 1B is a layout view of chip areas, in accordance with some embodiments.

By way of example and not limitation, FIG. 1B is a layout view of chip areas A' and A" discussed above with respect to FIG. 1A. The layout view of FIG. 1B shows selective elements for FIG. 1A. In some embodiments, the cross-sectional view of chip area A' shown in FIG. 1A corresponds to a cross-section taken along line C-D of FIG. 1B. Accordingly, the cross-sectional view of chip area A" shown in FIG. 1A corresponds to a cross-section taken along line E-F of FIG. 1B. As shown in FIG. 1B and discussed above, air-gap 140 represented by a dashed line is formed in first chip area A' and does not extend into second chip area A". As a result, there is no overlap between air-gap 140 and gate contact 130.

As shown in FIG. 1A, the internal surfaces of air-gap 140 are lined with a liner 140a. In some embodiments, liner 140a includes one or more dielectric layers such as silicon nitride ($Si_3N_4$); silicon carbide (SiC); a stack of $Si_3N_4$ and SiC; a stack of ILD, $Si_3N_4$, and IMD; a stack of ILD, $Si_3N_4$, SiC, and IMD; or any combinations thereof.

In some embodiments, additional metallization layers are formed over second metallization layer 155, such as third metallization layer 160 having metal lines 160a and vias 160b. By way of example and not limitation, the metallization layers can be separated by etch stop layers 165. Further, a contact etch stop layer 170 can be formed on gate structure 100 in first and second chip areas A' and A", respectively, as shown in FIG. 1A. Further, contact etch stop layer 170 can extend on silicide layer 120 disposed on source/drain regions 105 in first chip area A' and on dielectric layer 102' in second chip area A". The etch stop layers (e.g., etch stop layers 165 and contact etch stop layer 170) facilitate the formation of the local and global interconnects such as source/drain contacts 125, gate contact 130, metal lines 135a, and vias 155b/160b. In some embodiments, additional etch stop layers may be formed between the structures of FIG. 1A. These additional etch stop layers are not shown in FIG. 1A for simplicity. Additional layers, such as barrier layers included in the metal lines, vias and contacts, work function layers in gate electrode 110a, dielectric layers in dielectric stack 110b, capping layers, or isolation structures may not be shown in FIG. 1A for ease of illustration.

In some embodiments, air-gap 140 in ILD 145 occupies between about 30% and about 70% of the available space between source/drain contacts 125 and transistor structure A. Additionally, air-gap 140 in first metallization layer 135 occupies between about 40% and about 90% of the available space between metal lines 135a of first metallization layer 135. In some embodiments, the shape of air-gap 140 can be different from the one shown in FIG. 1A. For example, the most bottom portion of air-gap 140 may extend towards silicide layer 120 disposed on source/drain regions 105 or may occupy the entire space between source/drain contact 125 and contact etch stop layer 170. In some embodiments, the volume of air-gap 140 in IMD 150 is larger than the volume of air-gap 140 in ILD 145. In some embodiments, air-gaps that occupy less than about 30% in ILD 145 and less than about 40% in first metallization layer 135 may not sufficiently reduce the RC delay when combined with shorter S/D contacts 125 and gate contacts 130. On the other hand, in some embodiments, air-gaps that occupy greater than about 70% in ILD 145 and greater than about 90% in first metallization layer 135 may compromise the mechanical strength of ILD 145 and first metallization layer 135.

Figure 2:
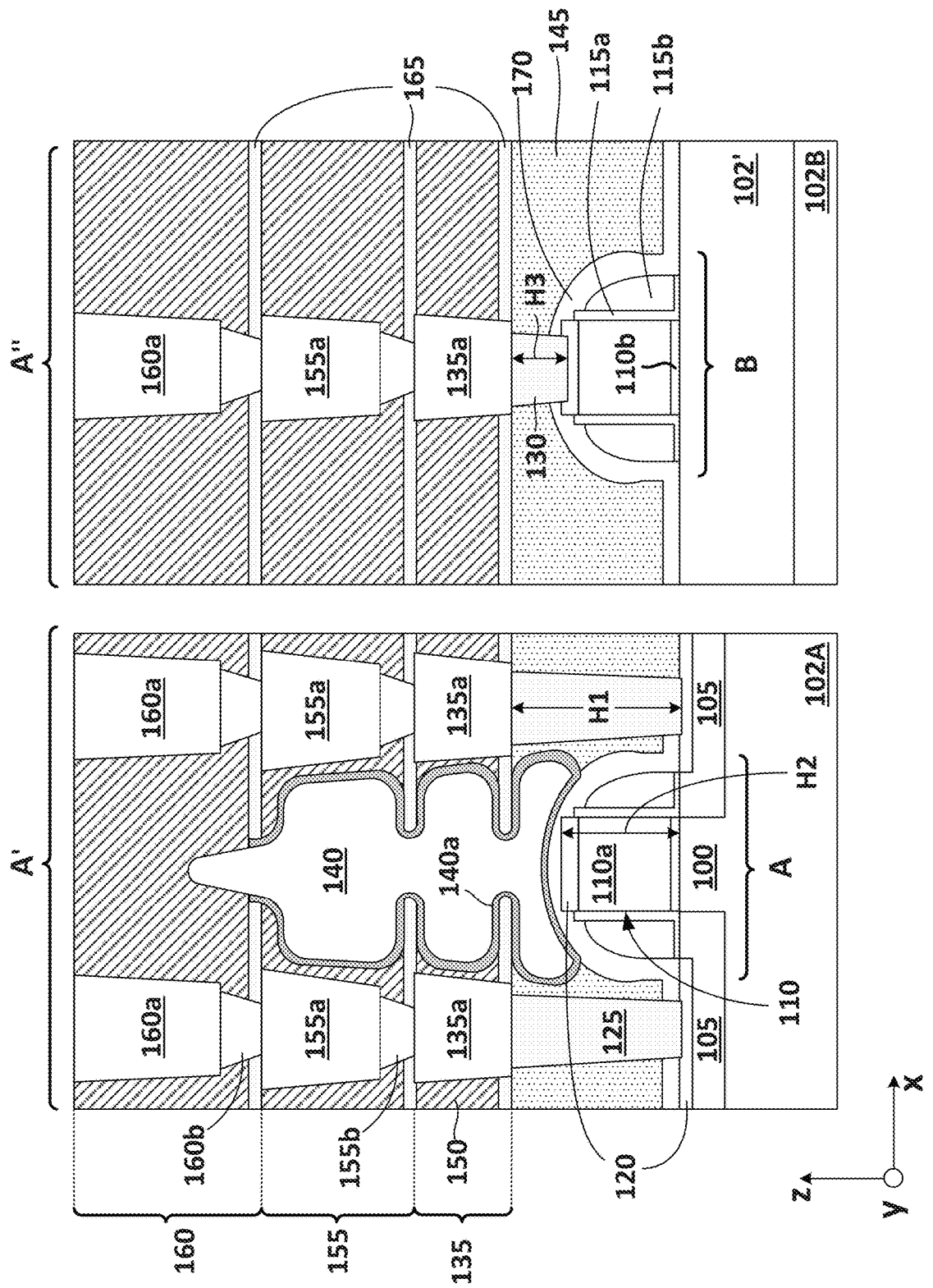
FIGS. 2 and 3 are cross-sectional views of local contacts with reduced height and air-gaps formed over transistor structures, in accordance with some embodiments.
Figure 3:
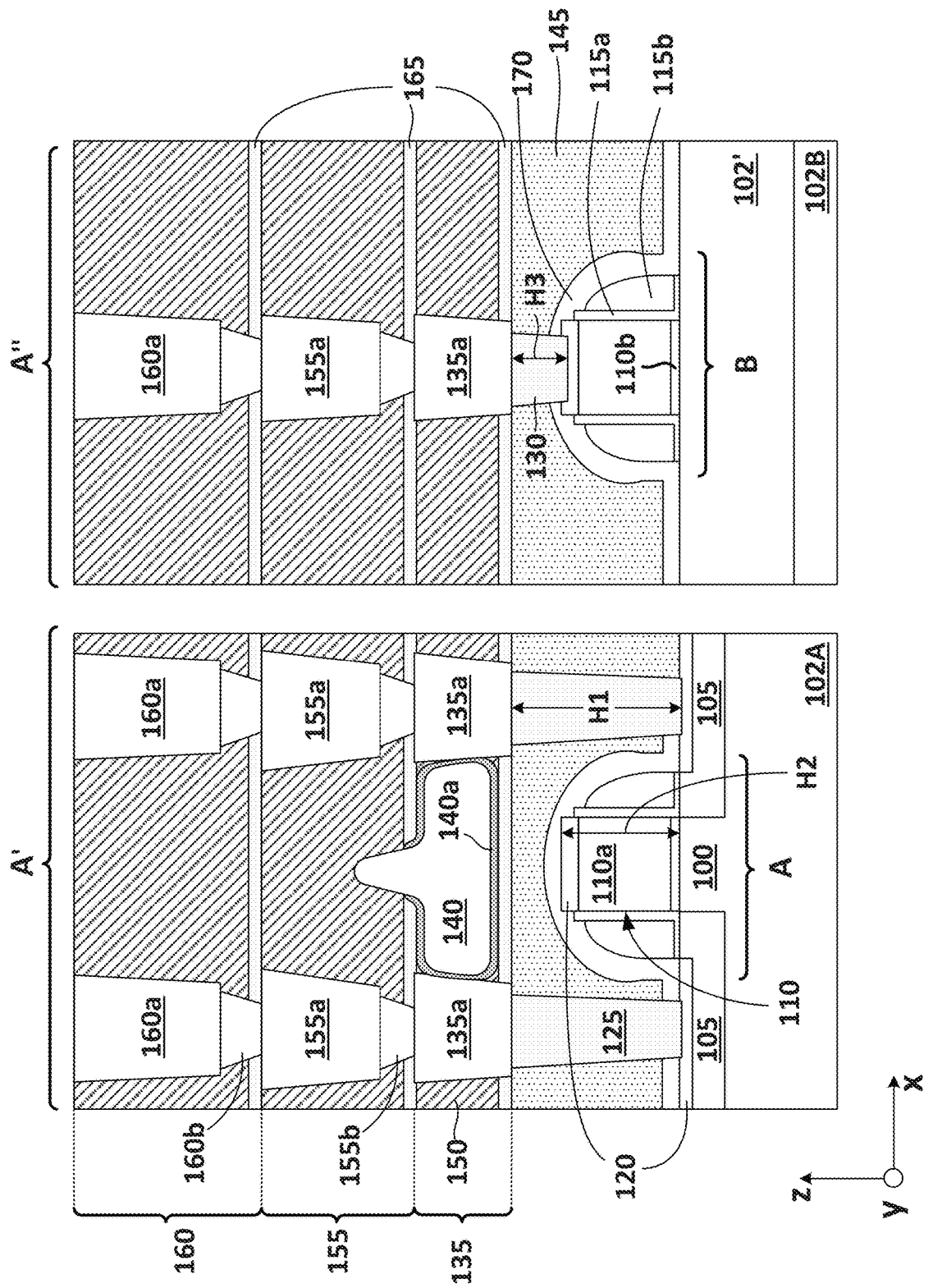

According to some embodiments, and to further reduce the parasitic capacitance and the RC delay, air-gap 140 may extend to second metallization layer 155 and third metallization layer 160 (e.g., along the z-direction) as shown in FIG. 2. In some embodiments, extending air-gap 140 into second metallization 155 further reduces the parasitic capacitance and the RC delay as compared to an air-gap that only extends into first metallization layer 135. In some embodiments, extending air-gap 140 into third metallization layer 160 may further reduce the parasitic capacitance and the RC delay as compared, for example, to an air-gap that only extends into second metallization layer 155. In some embodiments, all portions of air-gap 140 can be formed in a single or in more than one operation, as will be discussed later. In other embodiments, air-gap 140 may not be formed in ILD 145. For example, as shown in FIG. 3, air-gap 140 may be selectively formed in first metallization layer 135 and partially extend to second metallization layer 155. Therefore, air-gap 140 can be selectively formed in different locations to suppress the formation of parasitic capacitances.

Figure 4:
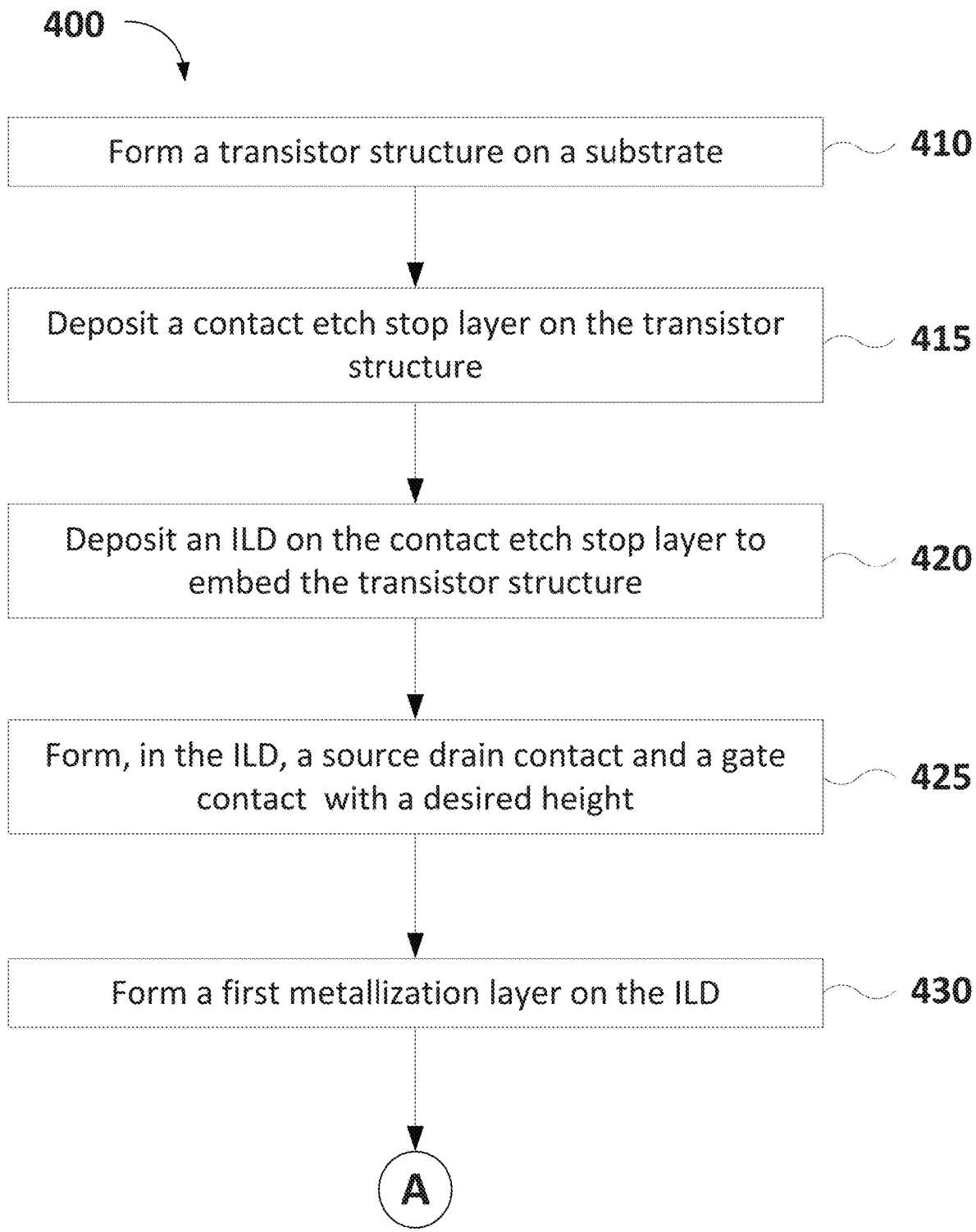
FIGS. 4 and 5 are flow chart diagrams of a method for the formation of local contacts with reduced height and air-gaps over transistor structures, in accordance with some embodiments.
Figure 5:
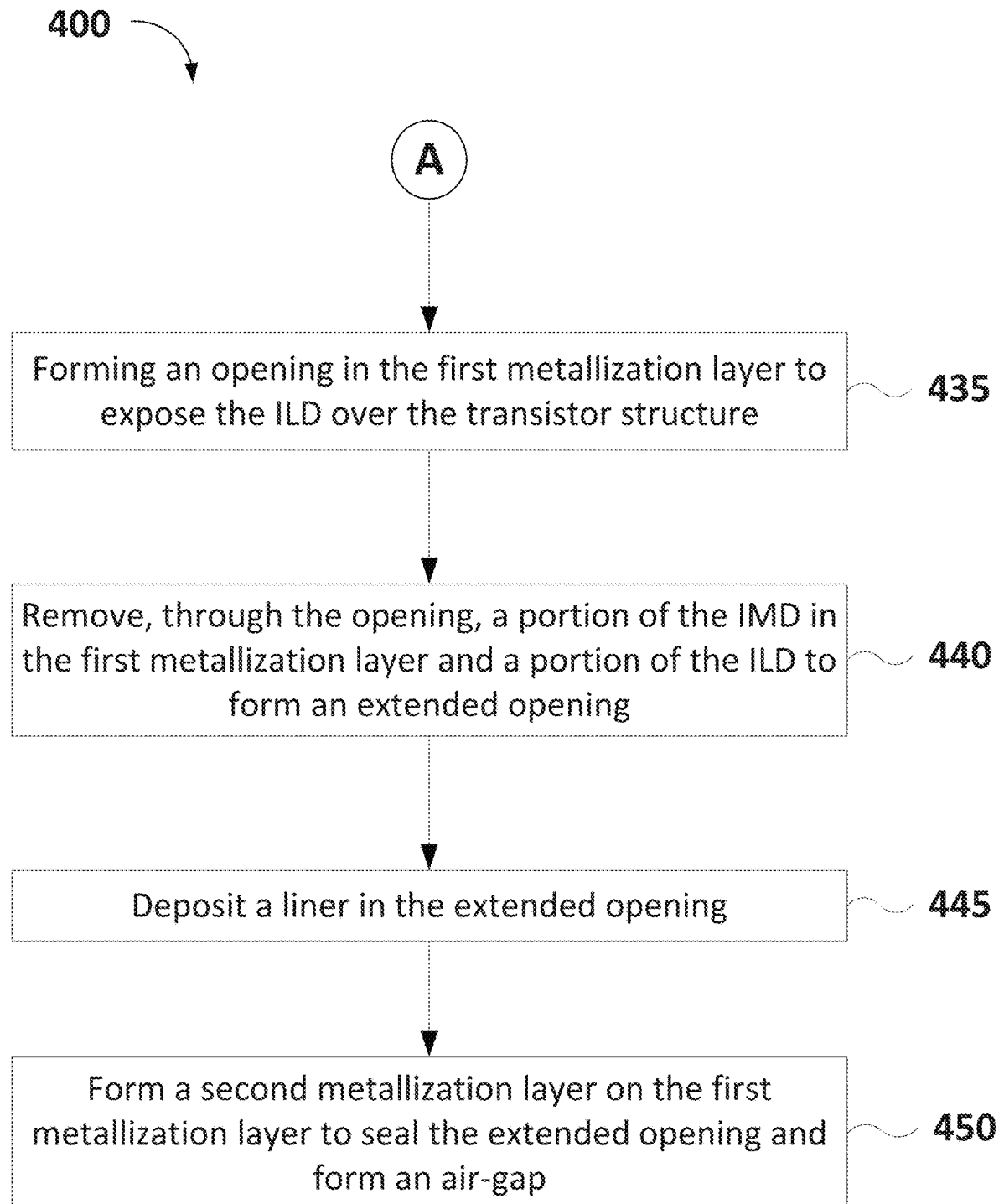

FIGS. 4 and 5 are flow charts of fabrication method 400 for the formation of local interconnects with reduced height and air-gaps as described above with respect to the embodiment shown in FIG. 1A. Modifications of method 400 can be used to form the air-gaps for the embodiments shown in FIGS. 2 and 3. Additional fabrication operations may be performed between the various operations of method 400 and may be omitted merely for clarity and ease of description. These additional fabrication operations are within the spirit and the scope of this disclosure. Moreover, not all operations may be required to perform the disclosure provided herein. Additionally, some of the operations may be performed simultaneously, or in a different order than the ones shown in FIGS. 4 and 5. In some embodiments, one or more other operations may be performed in addition to or in place of the presently described operations. For illustrative purposes, method 400 will be described with reference to the embodiments shown in FIGS. 6-10. The figures provided to describe method 400 are for illustrative purposes only and are not to scale. Some structures, films, or geometries may have been deliberately augmented for illustrative purposes.

Figure 6:
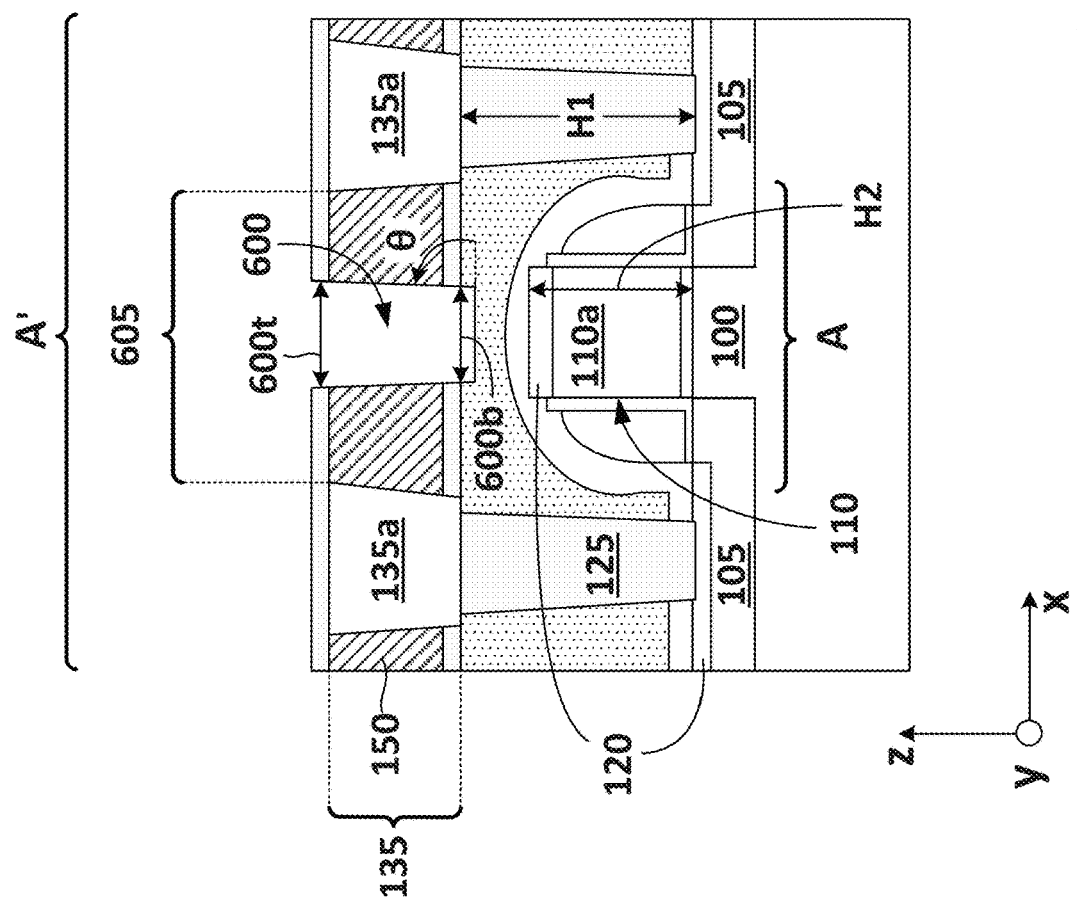
FIG. 6 is a cross-sectional view of an intermediate structure during the fabrication of an air-gap over a transistor structure, in accordance with some embodiments.

In referring to FIG. 4, method 400 begins with operation 410 and the process of forming a transistor structure on a substrate—like transistor structure A on a semiconductor substrate 102 shown in FIG. 6. In some embodiments, transistor structure A shown in FIGS. 1A and 6 are substantially similar. By way of example and not limitation, semiconductor substrate 102 can be a bulk semiconductor wafer (e.g., crystalline silicon), a semiconductor on insulator (SOI) wafer, or semiconductor fin structures formed on bulk semiconductor wafer or on an SOI wafer. In some embodiments, if transistor structure A is formed on fin structures, these fin structures will have a length along the x-direction of FIGS. 1A and 6 and a width along the y-direction of FIGS. 1A and 6. In some embodiments, channel regions 100 can be part of semiconductor substrate 102 or portions of the semiconductor fin structures formed on or from semiconductor substrate 102. Source/drain regions 105 include one or more epitaxial layers (e.g., epitaxially grown silicon-germanium layer, or epitaxially grown silicon layers doped with carbon and phosphorous, or carbon and arsenic) formed in recessed portions of semiconductor substrate 102 or on recessed portions of semiconductor fin structures. In some embodiments, source/drain regions 105 are merely doped regions of semiconductor substrate 102. In some embodiments, silicide layers 120 are the product of a silicidation process between a deposited metal and underlying silicon atoms if present. If no silicon atoms are present, no silicide formation will occur. For example, if gate electrode 100a is a metallic stack that includes metallic work function layers and metal fill, then a silicide layer 120 is not formed on gate structure 110. However, silicide formation is imperative for source/drain regions 105. In some embodiments, gate electrode 110a may include doped polysilicon or, alternatively, metallic layers. When gate electrode 110a is metallic, then gate dielectric stack 110b includes a high-k dielectric material for optimum performance. The metallic layers include one or more work function layers and metal fill materials.

Referring to FIGS. 4 and 6, method 400 continues with operation 415 and the process of depositing a contact etch stop layer 170 on gate structure 110 of transistor structure A in first and second chip areas A' and A", respectively. Since, contact etch stop layer 170 facilitates the formation of the local interconnects, it can be blanket deposited over areas of the chip where local interconnects (e.g., source/drain and gate contacts) will be formed. By way of example and not limitation, contact etch stop layer 170 includes a nitride, such as $Si_3N_4$ and any other suitable material, that provides good etching selectivity with respect to the surrounding materials (e.g., ILD 145).

Referring to FIGS. 4, method 400 continues with operation 420 and the process of depositing ILD 145 on contact etch stop layer 170 to embed transistor structure A as shown in FIG. 6. As discussed above, ILD 145 electrically isolates gate structure 110 of transistor structure A from the subsequently formed local interconnects (e.g., source/drain contacts 125). By way of example and not limitation, ILD 145 can be a silicon based dielectric (e.g., silicon oxide) doped with carbon and containing nitrogen, hydrogen, or any other suitable dielectric material. ILD 145 can be deposited by any appropriate deposition method, such as chemical vapor deposition (CVD), plasma-enhanced CVD (PECVD), flowable CVD, etc.

Referring to FIGS. 4 and 6, method 400 continues with operation 425 and the process of forming source/drain contacts 125 in first chip area A' and gate contact 130 in second chip area A" with a desired height. As discussed earlier with respect to FIG. 1A, heights H1 and H3 of respective source/drain contacts 125 and gate contact 130 are adjusted so that height H1 of source/drain contacts 125 is greater than height H2 and equal to or less than about 2.5 times height H2 (e.g., 1<H1/H2≤2.5), and height H3 of gate contact 130 is equal to or greater than about 0.25 times height H2 and equal to or less than about 1.5 times height H2 (e.g., 0.25<H3/H2≤1.5). These heights (and height ratios) are not limiting and other values are within the spirit and scope of this disclosure. As discussed above, in some embodiments, source/drain contacts 125 greater than about 2.5 times height H2 and gate contacts with height H3 greater than about 1.5 times height H1 are more resistive and, therefore, increase the resistance component of the RC delay. Further, in some embodiments, source/drain contacts 125 shorter than height H2 and gate contacts 130 shorter than 0.25 times height H2 increase the parasitic capacitance formed between metal line 135*a* and gate structure 110, which is not desirable.

There are several ways to accomplish the above mentioned height ratios. By way of example and not limitation, one method includes depositing a thick ILD 145 (e.g., thicker than the desired heights H1 and H3), forming contact openings in ILD 145 with photolithography and etching operations, filling the contact openings with conductive material, and planarizing ILD 145 by an appropriate amount to achieve the desired ratios for H1 and H3. Planarization of ILD 145 can be achieved, for example, with a chemical mechanical polishing (CMP) process. If the CMP process introduces undesirable thickness variation across the chip, an alternative method includes depositing ILD 145 to a thickness closer to the desired heights H1 and H3, so that the CMP process removes smaller amounts of ILD material during polishing. The above mentioned methods are exemplary and not limiting. Alternative methods are possible and are within the spirit and the scope of this disclosure.

It is noted that the etching chemistry used to form contact openings for respective source/drain contacts 125 and gate contact 130 is configured to exhibit a low selectivity towards contact etch stop layer 170 (e.g., silicon nitride) compared to ILD 145 (e.g., silicon oxide). This is beneficial because it facilitates the formation of contacts with different heights. For example, source/drain contact openings and gate contact openings are formed concurrently. However, since gate contact openings are shorter than source/drain contact openings, the gate contact opening will be formed first. While the source/drain contact openings continue to be etched with the etching chemistry, the etching of the gate contact opening slows down substantially because the etching chemistry cannot etch through contact etch stop layer 170. When both source/drain and gate openings are formed, the etching chemistry can be switched to a different one that is now selective towards contact etch stop layer 170, so that the etch stop layer can be removed and the underlying layer can be exposed (e.g., gate electrode 110*a* and source/drain regions 105). The thickness of contact etch stop layer 170 can be adjusted based on the extra amount of time required to form the source/drain contact openings. In some embodiments, silicide layers 120 on source/drain regions 105 may be formed after the formation of source/drain openings depending on the integration scheme.

Referring to FIG. 4, method 400 continues with operation 430 and the process of forming a first metallization layer on ILD 145. Referring to FIG. 1A, first metallization layer 135 can be formed, for example, by depositing etch stop layer 165 on the polished ILD 145; subsequently depositing IMD 150 on etch stop layer 165; etching openings in IMD 150 and etch stop layer 165 to exposed the underlying local interconnects; depositing one or more conductive materials to fill the openings and form lines 135*a*; and polishing down excess deposited material over IMD 150 so that top surfaces of lines 135*a* are coplanar with top surfaces of IMD 150 as shown in FIG. 1A.

Like contact etch stop layer 170, etch stop layer 165 can also include a nitride, such as $Si_3N_4$. Further IMD 150, like ILD 145, can be a similar silicon oxide based dielectric; such as, carbon doped silicon oxide containing hydrogen or nitrogen. In some embodiments, IMD 150 can be a porous material like, for example, silicon oxide with pores. According to some embodiments, the conductive material used to fill lines 135*a* is different from the conductive material used to fill source/drain contacts 125 and gate contact 130. By way of example and not limitation, lines 135*a* can be filled with copper while source/drain contacts 125 and gate contact 130 can be filled with cobalt or tungsten. Further, lines 135*a* may be larger (e.g., wider) than source/drain contacts 125 and gate contact 130.

Referring to FIG. 5, method 400 continues with operation 435 and the process of forming an opening in first metallization layer 135 to expose ILD 145 over transistor structure A. In some embodiments, the opening formed in operation 435 will be used to form air-gap 140 shown in FIG. 1A. The opening of operation 435 is formed in first chip area A' and does not extend to second chip area A" as discussed above. By way of example and not limitation, the opening can be formed by depositing a photoresist on IMD 150, patterning the photoresist, and etching IMD 150 of first metallization layer 135 through the openings in the photoresist. After the formation of the opening in first metallization layer 135, the photoresist can be removed, for example, with a wet etching process. The resulting structure is shown in FIG. 6 where opening 600 is formed in IMD 150 of first metallization layer 135 to expose ILD 145. In some embodiments, opening 600 is partially formed in ILD 145.

According to some embodiments, sidewall angle θ of opening 600 can be about 90°, greater than about 90° (e.g., 110°), or less than about 90° (e.g., 80°). In some embodiments, sidewall angle θ is about 90°±20°. However, these angles are not limiting and opening 600 can be formed with angles larger than 110° or less than about 80°. By way of example and not limitation, opening 600 can have substantially vertical sidewalls with a top opening 600*t* being substantially equal to bottom opening 600*b* (e.g., 600*t*=600*b*), a positive taper profile with top opening 600*t* being wider than bottom opening 600*b* (e.g., 600*t*>600*b*), or can have a negative taper profile with top opening 600*t* being narrower than the bottom opening 600*b* (e.g., 600*t*<600*b*). The profile of opening 600 determines to an extent the shape of the air-gap formed in operation 450. In some embodiments, top opening 600*t* is between about 25% and about 30% of distance 605 between neighboring lines 135*a*. However, these percentages are not limiting and wider or narrower top openings 600*t* can be formed.

Figure 7:
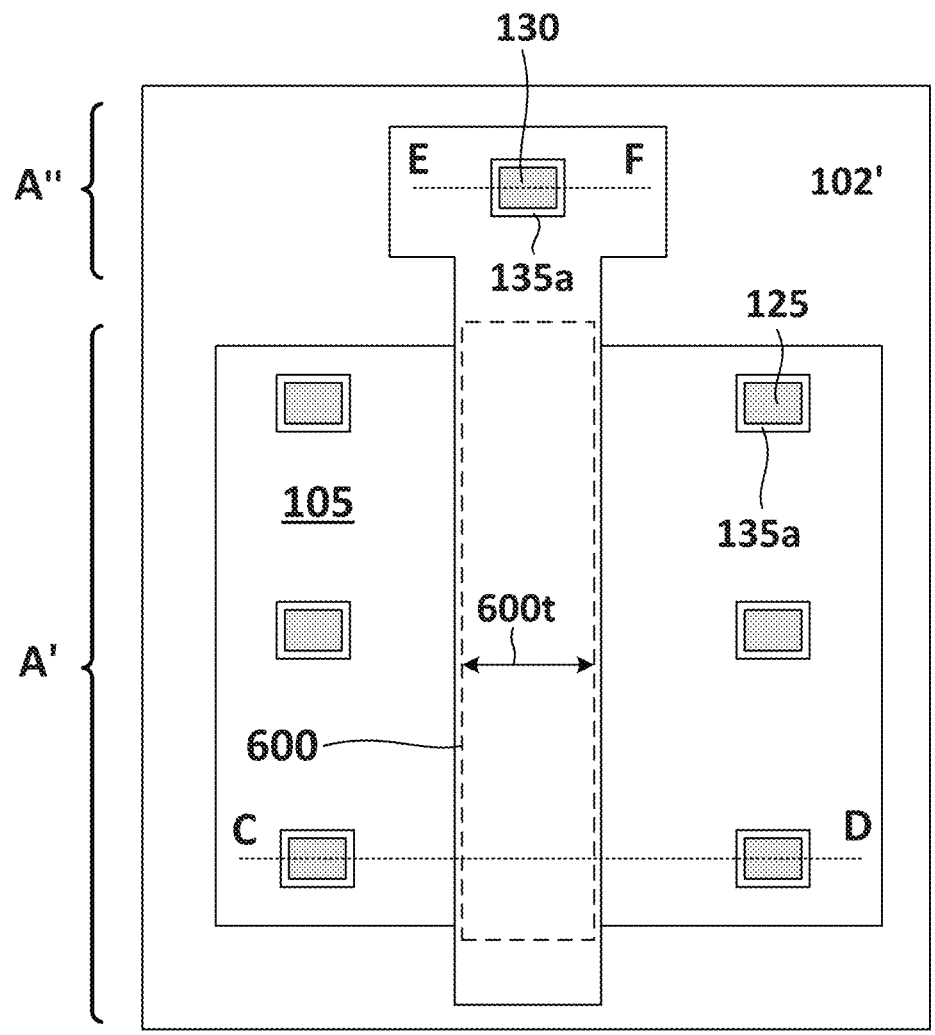
FIG. 7 is a top view of an intermediate structure during the fabrication of air-gaps over transistor structures, in accordance with some embodiments.

It is noted that additional openings, like opening 600, can be formed within first metallization layer 135 in other locations of the chip over other transistor structures. By way of example and not limitation, FIG. 7 is an exemplary top view of transistor structure A in FIG. 6. FIG. 7 shows selective portions of FIG. 6 and other portions are omitted merely for clarity. Similarly to the case of FIGS. 1A and 1B, the cross-sectional view of chip area A' shown in FIG. 6 corresponds to a cross-section taken along line C-D of FIG. 7. Accordingly, the cross-sectional view of chip area A" shown in FIG. 6 corresponds to a cross-section taken along line E-F of FIG. 7. As shown in FIG. 7 and discussed above, opening 600 represented by a dashed line is formed in first chip area A' and does not extend into second chip area A". As a result, there is no overlap between opening 600 and gate contact 130. The top view of FIG. 7 is exemplary and not limiting. Therefore, different arrangements for the elements of FIG. 6 are possible and are within the spirit and the scope of this disclosure. In some embodiments, the size of opening 600 along the y-direction can define the lateral size of the air-gap in that direction.

Figure 8:
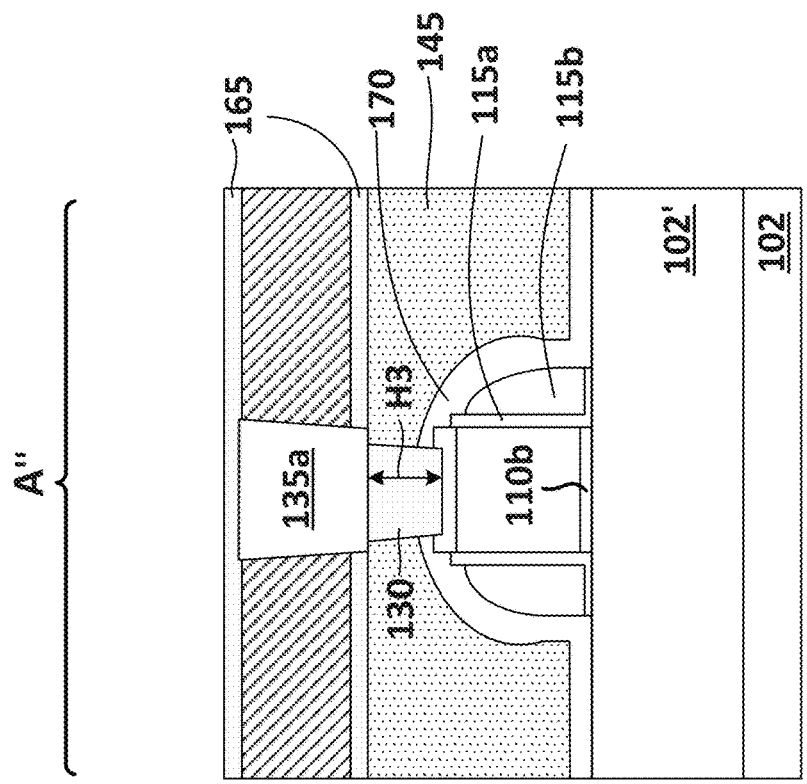
FIGS. 8-10 are cross-sectional views of intermediate structures during the fabrication of an air-gap over a transistor structure, in accordance with some embodiments.
Figure 8:
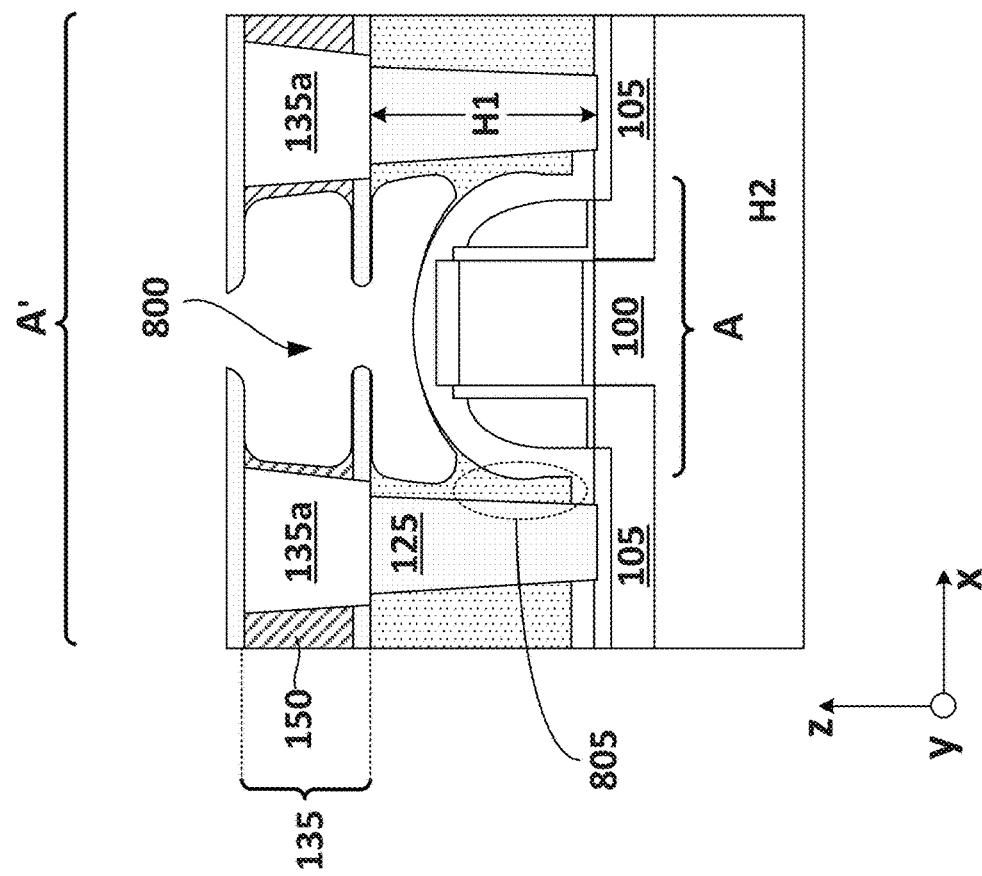

Referring to FIG. 5, method 400 continues with operation 440 and the process of removing, through opening 600, a portion of IMD 150 in first metallization layer 135 and a portion of ILD 145 to form an extended opening, like the extended opening 800 shown in FIG. 8. In some embodiments, extended opening 800 extends along the y-direction, in addition to the x-z plane shown in the cross-sectional view of FIG. 8. In some embodiments, the etching process used to form extended opening 800 includes a dry etching chemistry, a wet etching chemistry, or a combination thereof. According to some embodiments, the etching chemistry is isotropic or a combination of isotropic and anisotropic with a high selectivity towards silicon oxide-based materials, such as IMD 150 and ILD 145, and a low selectivity towards etch stop layer 165 and contact etch stop layer 170 (e.g., silicon nitride or nitride materials). In addition, the etching chemistry is configured to exhibit low selectivity towards the materials used in lines 135a and source/drain contacts 125. In some embodiments, due to the isotropy of the etching process, extended opening 800 may develop curved or rounded internal surfaces (e.g., convex or concave surfaces), straight internal surfaces, or a combination thereof. For the same reasons, extended opening 800 may develop sharp corners, rounded corners, or a combination thereof. Therefore, the shape of extended opening 800 may deviate from what is shown in FIG. 8.

By way of example and not limitation, the dry etching chemistry can be based on a fluorocarbon chemistry and may include tetrafluoromethane ($CF_4$), octafluoropropane ($C_3F_8$), octafluorocyclobutane ($C_4F_8$), fluoroform ($CHF_3$), nitrogen trifluoride ($NF_3$), sulfur trifluoride ($SF_3$), or combinations thereof. The dry etching chemistry may also include buffer gases such as argon (Ar) or helium (He). The selectivity of the dry etching chemistry may be fine-tuned with the addition of hydrogen or oxygen in the gas mixture.

By way of example and not limitation, the wet etching chemistry can include hydrofluoric acid (HF) buffered in ammonium fluoride ($NF_4F$), which is referred to as buffered oxide etch (BOE) or buffered HF(BHF). Silicon oxide is an amorphous material that etches isotropically when exposed to BOE.

The etching process can be timed so that the size of extended opening 800 can be controlled. In some embodiments, extended opening 800 may extend to area 805 between contact etch stop layer 170 and source/drain contact 125 as discussed above.

Figure 9:
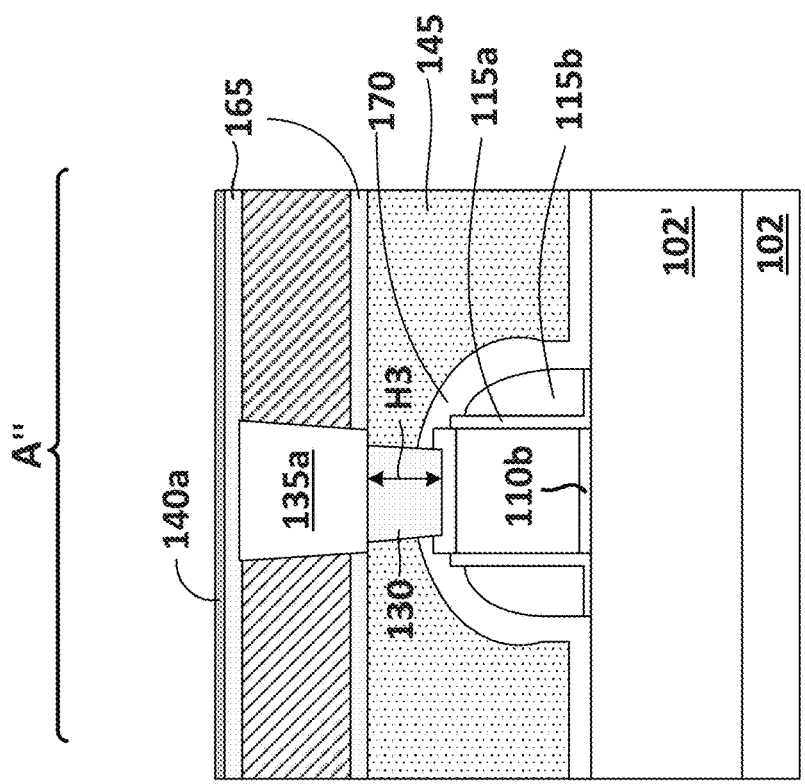
Figure 9:
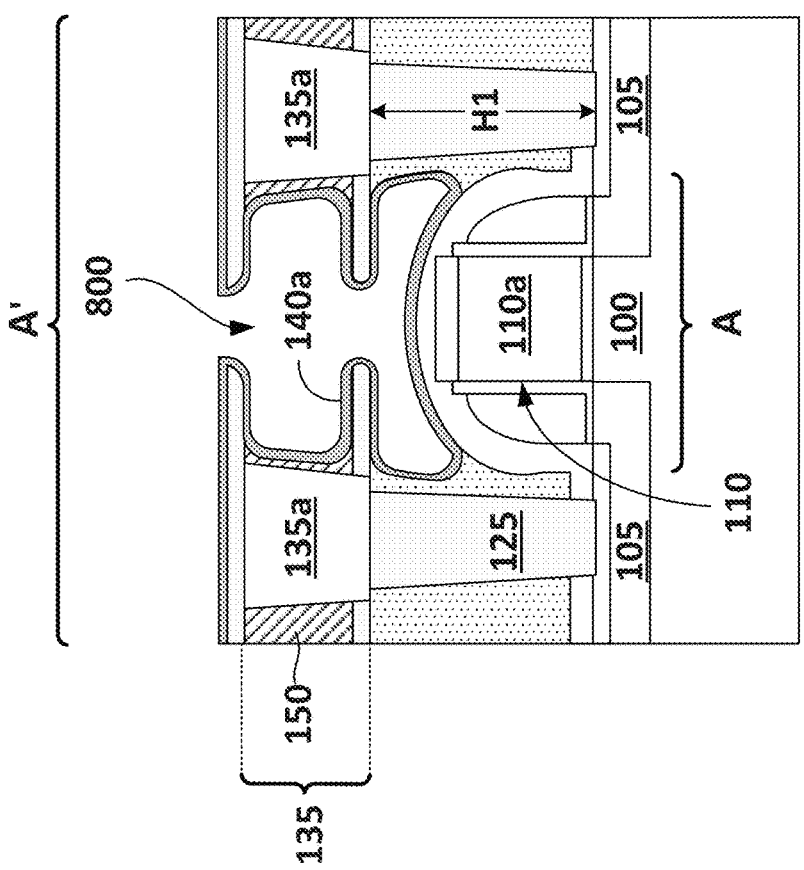
Figure 10:
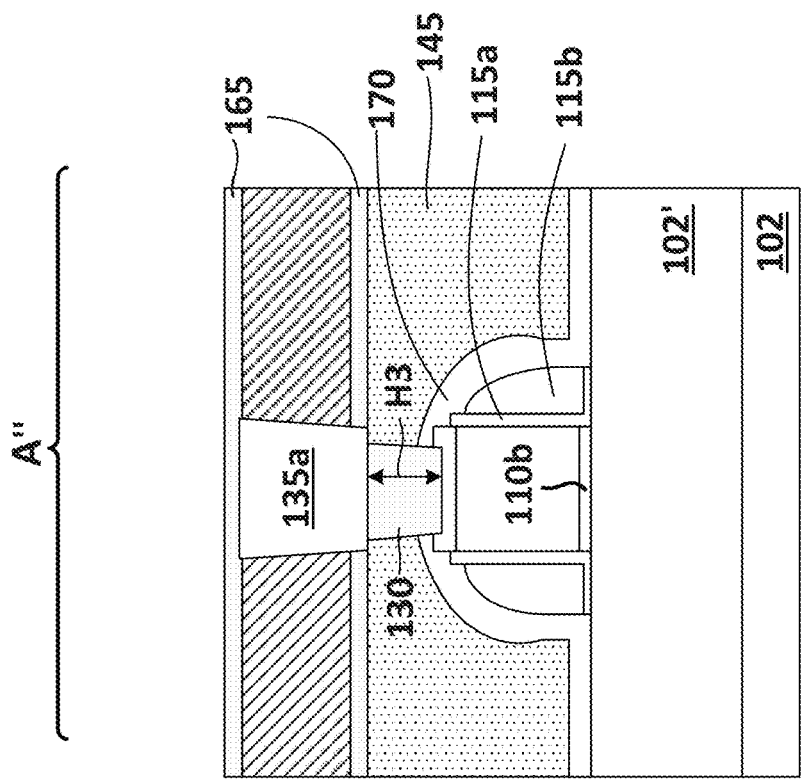
Figure 10:
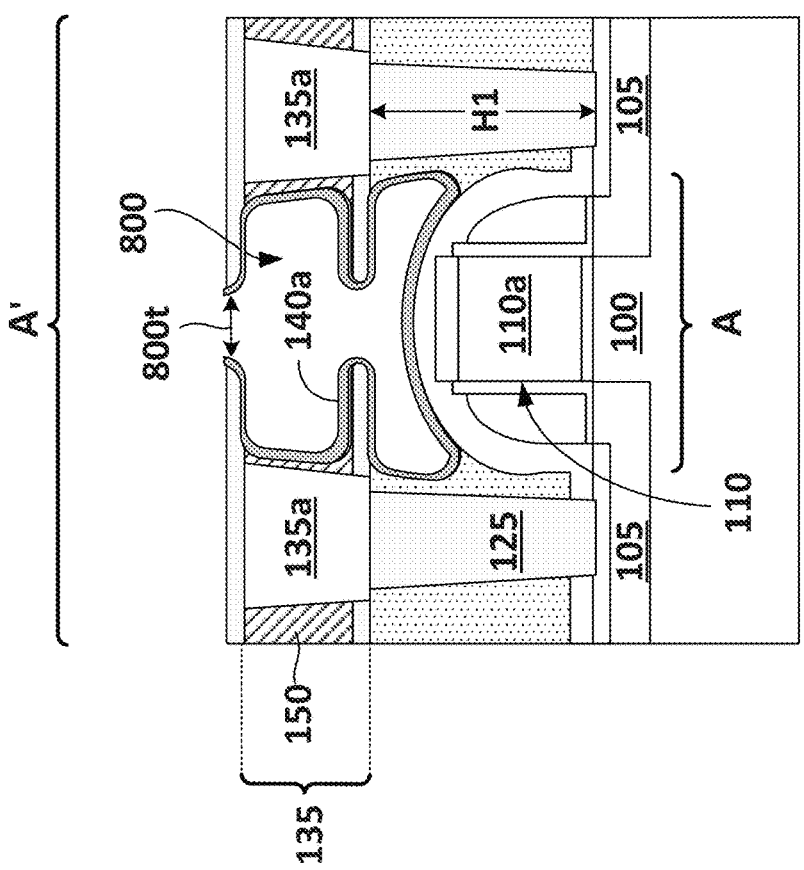
Figure 11:
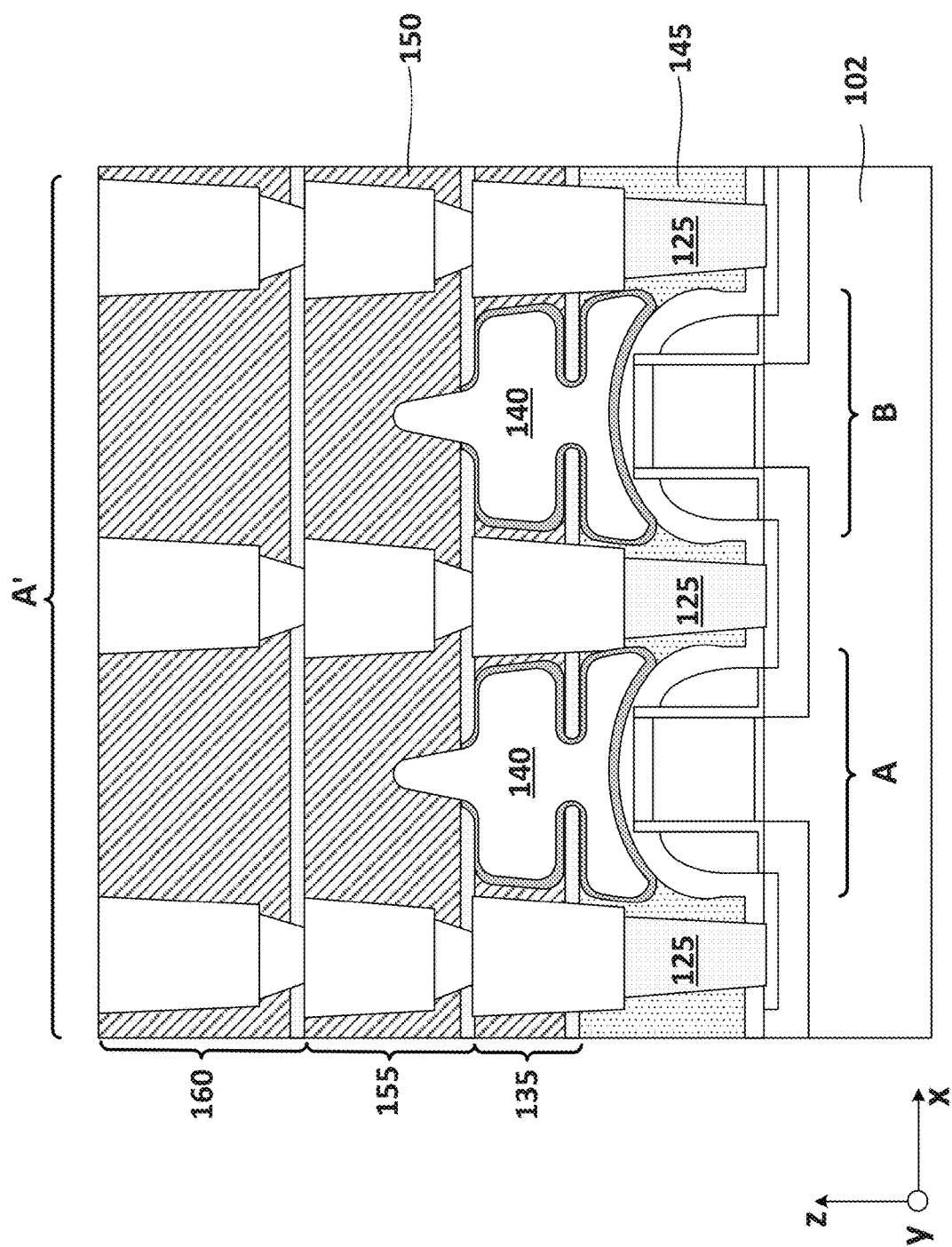
FIGS. 11-16 are cross-sectional views of local contacts with reduced height and air-gaps formed over transistor structures, in accordance with some embodiments.

Referring to FIG. 5, method 400 continues with operation 445 and the process of depositing a liner (e.g., like liner 140a shown in FIG. 1A) in extended opening 800. By way of example and not limitation, FIG. 9 shows liner 140a deposited in extended opening 800. In some embodiments, liner 140a is also deposited outside extended opening 800 (e.g., on horizontal surfaces of etch stop layer 165). However, portions of liner 140a outside extended opening 800 may be removed via an anisotropic etching operation if desired as shown in FIG. 10. As discussed above, liner 140a includes a single layer or a stack of dielectric layers. For example, liner 140a includes one or more dielectric layers such as $Si_3N_4$; SiC; a stack of $Si_3N_4$ and SiC; a stack of ILD, $Si_3N_4$, and IMD; a stack of ILD, $Si_3N_4$, SiC, and IMD; or any combinations thereof. By way of example and not limitation, the thickness of liner 140a ranges between about 10 nm and about 50 nm. Liner 140a does not fill extended opening 800 but instead covers the internal sidewalls (or the internal sidewall surfaces) of opening 800 as shown in FIG. 10. Due to the deposition of liner 140a, top opening 800t of extended opening 800 is reduced by the amount of liner's 140a thickness on the sidewalls of upper etch stop layer 165. In some embodiments, and prior to the deposition of liner 140a, top opening 800t is substantially equal to top opening 600t of opening 600 shown in FIG. 6 provided that the etching chemistry used for the formation of extended opening 800 does not erode etch stop layer 165.

In some embodiments, liner 140a is deposited with a conformal deposition process such as atomic layer deposition (ALD), plasma-enhanced ALD (PEALD), chemical vapor deposition (CVD), plasma-enhanced CVD (PECVD), or any deposition process capable of depositing conformal layers at a combined thickness between about 10 nm and about 50 nm.

Referring to FIG. 5, method 400 continues with operation 450 and the process of forming a second metallization layer (e.g., like second metallization layer 155 shown in FIG. 1A) on first metallization layer 135 to seal extended opening 800 and form air-gap 140. In referring to FIG. 1A, second metallization layer 155 can be formed, for example, by depositing another etch stop layer 165 on IMD 150 of first metallization layer 135; etching IMD 150 and etch stop layer 165 to exposed the underlying metal lines 135a and form via and line openings; depositing one or more conductive materials to fill the via and line openings with, for example, a dual damascene process to form vias 155b and metal lines 155a; and polishing down excess deposited material over IMD 150 so that top surfaces of metal lines 155a are coplanar with top surfaces of IMD 150 as shown in FIG. 1A. In some embodiments, additional metallization layers (e.g., such as third metallization layer 160) can be formed on second metallization layer 155.

According to some embodiments, during the deposition of IMD 150 of second metallization layer 155, a pinch point or a rounded top surface 140b is formed within IMD 150 as shown in FIG. 1A. Pinch point or rounded top surface 140b can be attributed to an overhang formation by the IMD material during the early stages of the IMD deposition. In some embodiments, pinch point or rounded top surface 140b shown in FIG. 1A is a characteristic of air-gap 140 as shown in FIGS. 2 and 3 (and subsequently in FIGS. 11-16). In some embodiments, pinch point or rounded top surface 140b does not extend into an adjacent metallization layer for more than about 60% of the height of the adjacent metallization layer. For example, in FIG. 1A, height $140b_h$ of pinch point or rounded top surface 140b is less than about 60% of height $155h$ of second metallization layer 155 (e.g., $140b_h < 0.6$ 155*h*). As the overhang closes top opening 800*t* shown in FIG. 10, deposition of IMD material in extended opening 800 can be prevented. Therefore, top opening 800*t* and the deposition rate of IMD 150 facilitate the formation of air-gap 140 shown in FIG. 1A.

By way of example and not limitation, top opening 800*t* can be modulated by opening 600—and more specifically by top opening 600*t* shown in FIG. 6. In some embodiments, sidewall angle θ can be adjusted based on the deposition rate of IMD 150 to facilitate the formation of air-gap 140. For example, a positive taper profile with top opening 600*t* being wider than bottom opening 600*b* (e.g., 600*t*>600*b*) can be appropriate for high deposition rate processes. Meanwhile, a negative taper profile with top opening 600*t* being narrower than the bottom opening 600*b* (e.g., 600*t*<600*b*) can be appropriate for lower deposition rate processes. Further, a negative taper profile for opening 600 means that top opening 800*t* will be smaller and seal sooner during the deposition of IMD 150. By way of example and not limitation, the size and profile of opening 600 can be adjusted by the patterning and etching processes used to form opening 600, which are described in operation 435 of FIG. 5.

As discussed above, the size of top opening 800*t* relates to the size of top opening 600*t*. Further, as discussed above, top opening 600*t* can be, for example, between about 25% and about 30% of distance 605 between neighboring lines 135*a* shown in FIG. 6. In some embodiments, if top opening 600*t* is less than about 25% of distance 605, the etching chemistry used to form extended opening 800 may be unable to reach ILD 145 or may require longer etching times, which is undesirable. On the other hand, in some embodiments, if top opening 600*t* is larger than about 30% of distance 605, formation of air-gap 140 shown in FIG. 1A can be challenging since IMD material can be deposited in and fill extended opening 800 shown in FIG. 8.

Modifications to method 400 can be used to form air-gap 140 shown in FIG. 2. In some embodiments, to produce the air-gap shown in FIG. 2, the method can form first and second metallization layers 135 and 155; form an opening 600 in second metallization layer 155 that extends to the first metallization layer 136 and ILD 145; form the extended opening within IMD 150 of the second and first metallization layers and ILD 145; deposit liner 140*a*; and form third metallization layer 160. An alternative way to produce the air-gap shown in FIG. 2 is to extend air-gap 140 shown in FIG. 1A to second metallization layer 155. For example, starting from air-gap 140 shown in FIG. 1A, forming an opening 600 in second metallization layer 155, prior to the formation of third metallization layer 160, to expose air-gap 140 in first metallization layer 135, forming an extended opening 800 in second metallization layer 155; depositing liner 140*a* in the new extended opening 800; and forming third metallization layer 160 to form air-gap 140 shown in FIG. 2. In some embodiments, the existing liner 104*a* in air-gap 140 of FIG. 1A protects the surrounding IMD 150 in first metallization layer 135 and ILD 145 form further etching by the etching chemistry used to form the air-gap 140 in second metallization layer 155 of FIG. 2.

In some embodiments, modifications to method 400 can be used to form air-gap 140 shown in FIG. 3. In some embodiments, the air-gap shown in FIG. 3 can be formed when opening 600 shown in FIG. 6 and described in operation 435 stops on etch stop layer 165 over ILD 145—e.g., when opening 600 does not expose ILD 145. If opening 600 does not expose ILD 145, the subsequent etching process used in operation 440 will not remove ILD 145. With the aforementioned modifications, operations 440, 445, and 450 will lead to air-gap 140 shown in FIG. 3.

The above described modifications of method 400 are not limiting and alternative modifications are possible. These alternative modifications of method 400 are within the spirit and the scope of this disclosure.

Figure 12:
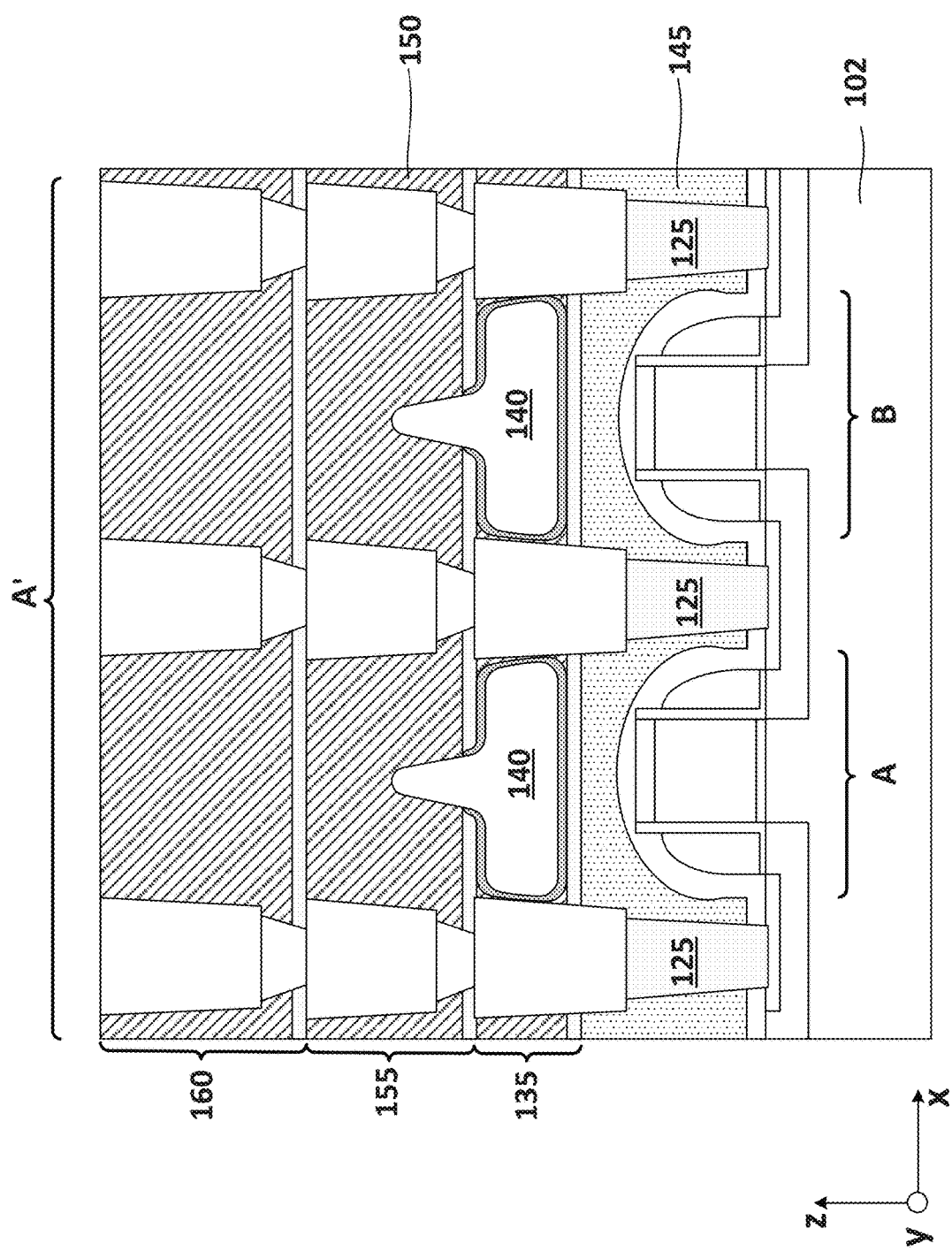
Figure 13:
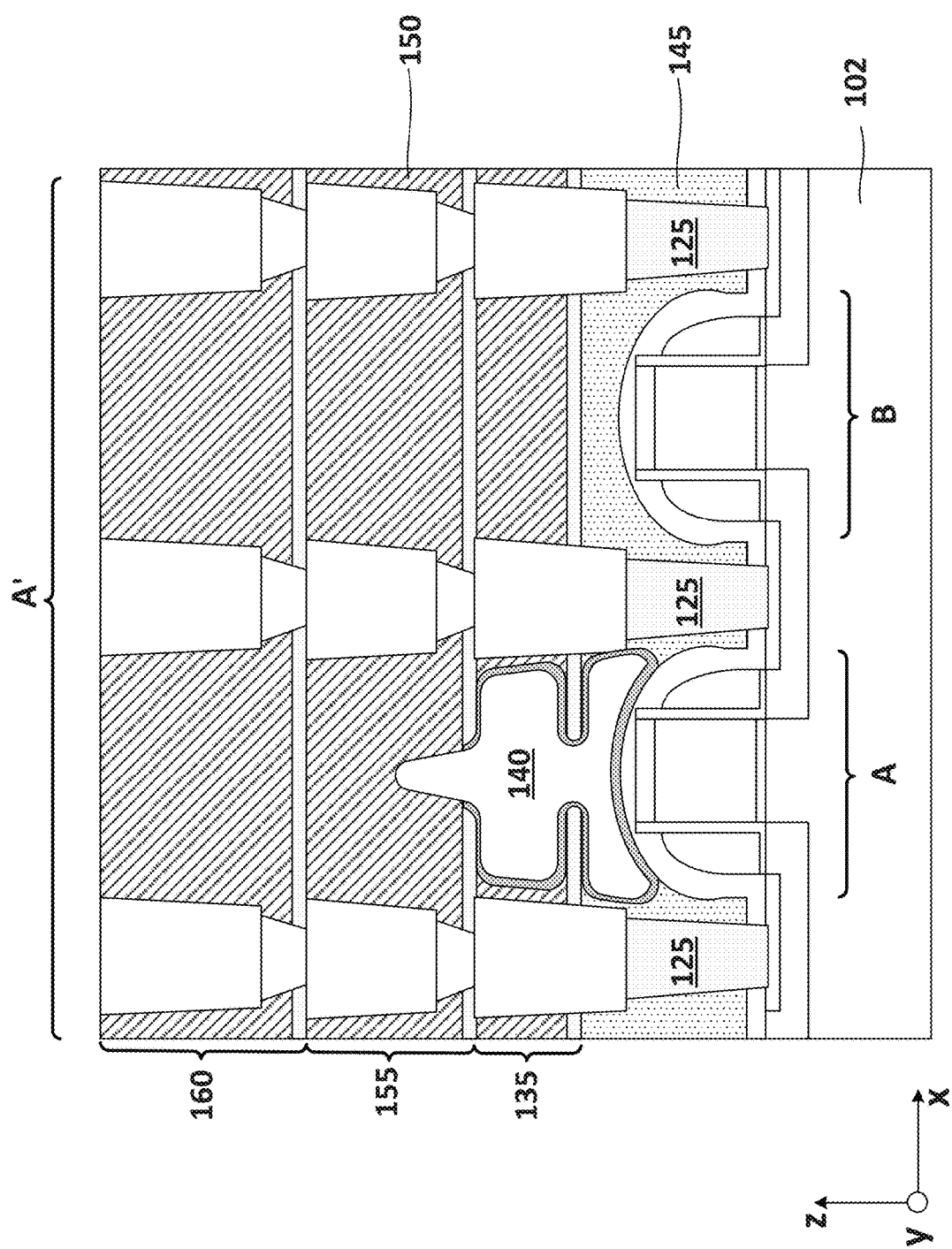
Figure 14:
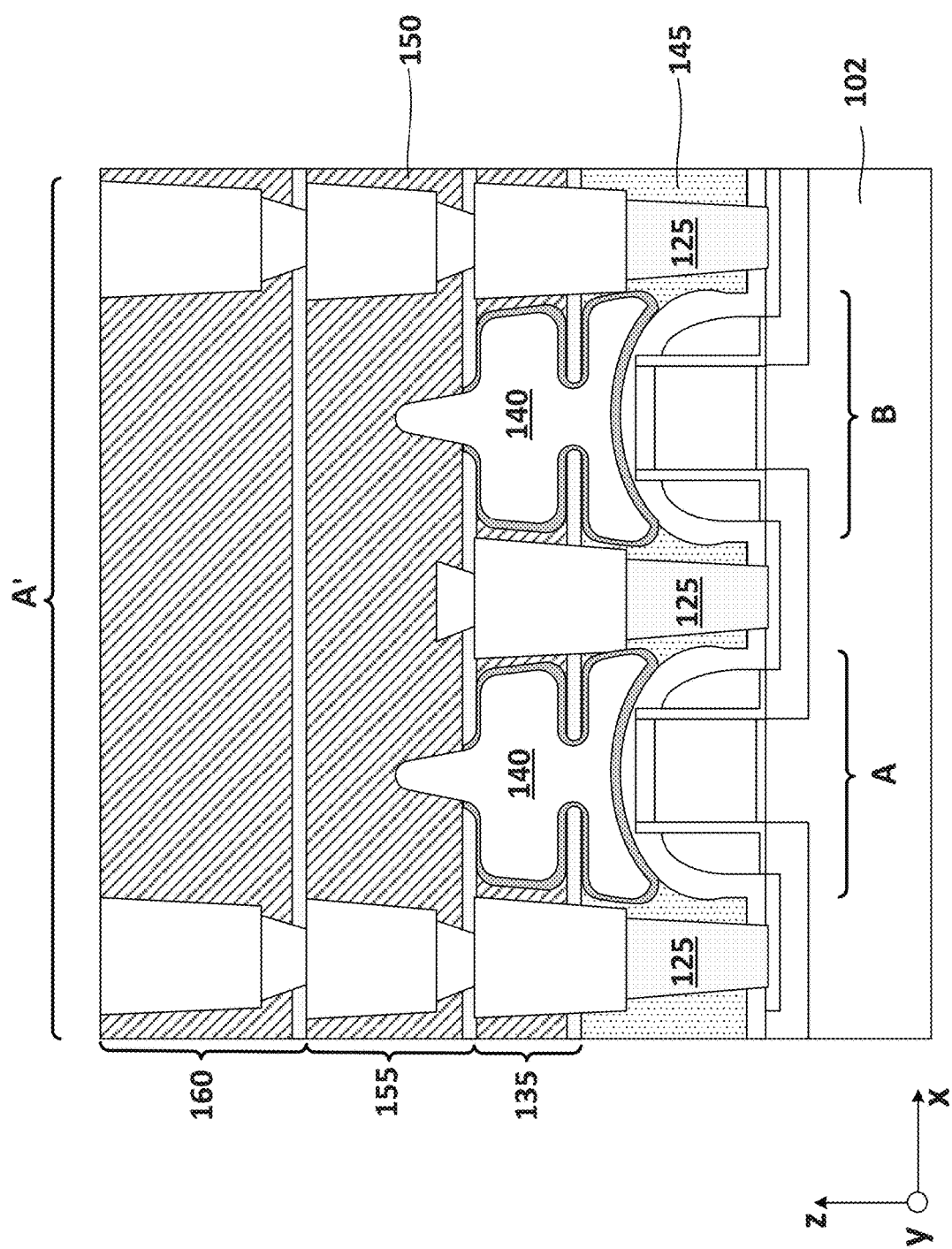
Figure 15:
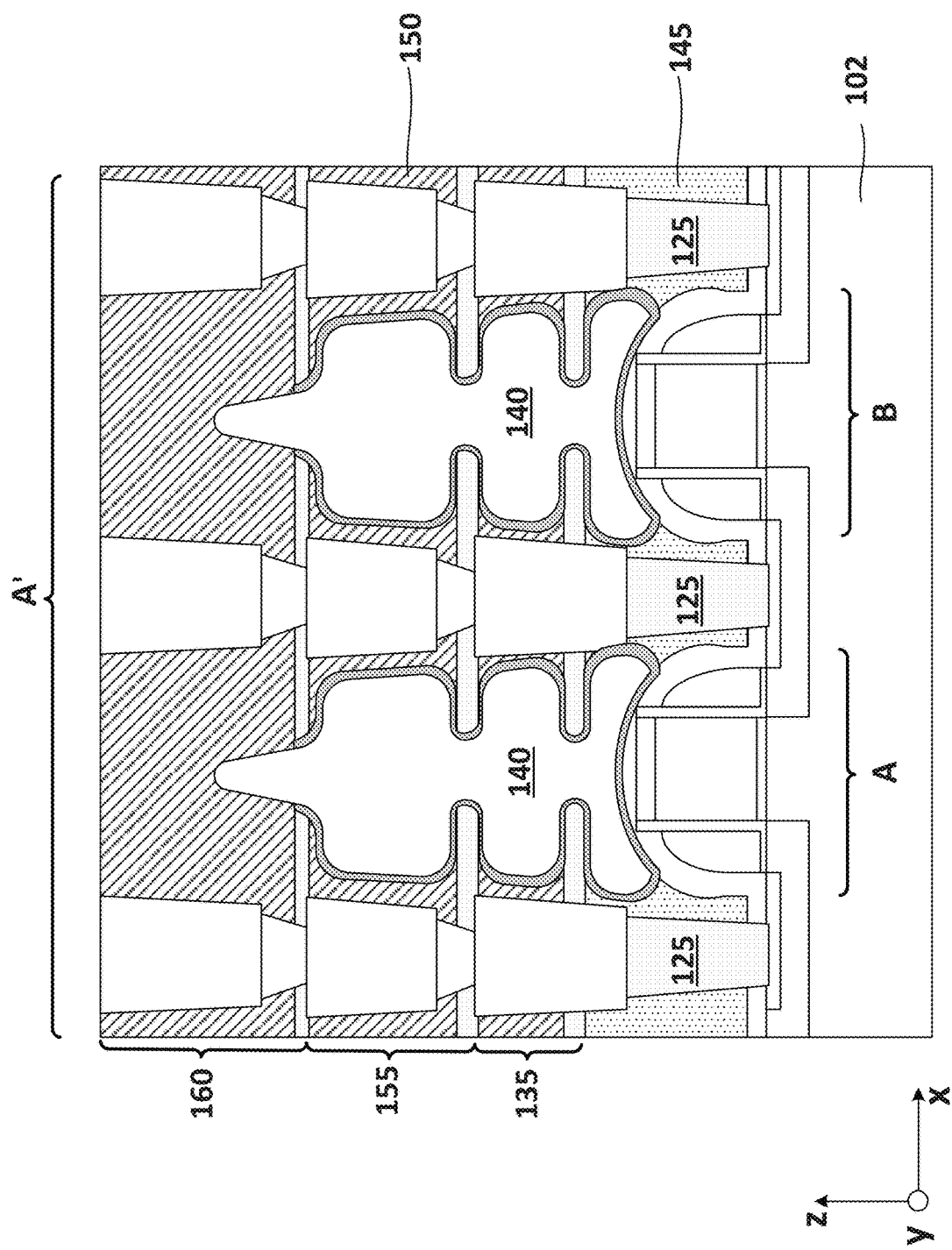
Figure 16:
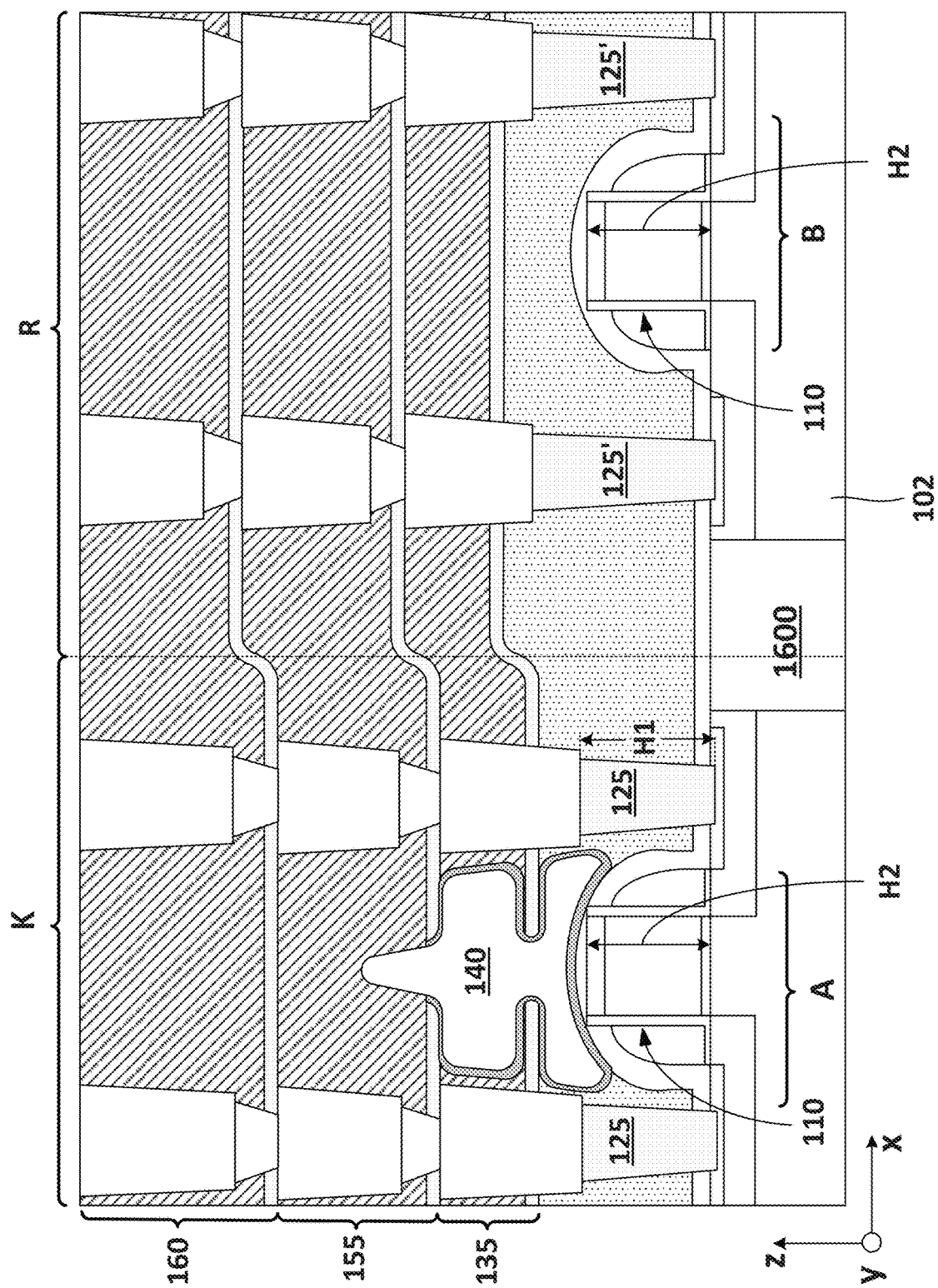

By way of example and not limitation, FIGS. 11 through 16 are examples of air-gaps 140 formed over similar transistor structures A and B in first chip area A' according to operations, or modified operations, of method 400 described above. For example, in FIG. 11, transistor structures A and B have an air-gap 140 extending through second metallization layer 155, first metallization layer 135, and ILD 145. In FIG. 12, air-gaps 140 in first metallization layer 135 and second metallization layer 155 are formed over both transistor structures A and B. In FIG. 13, air-gap 140 is formed selectively over transistor structure A while neighboring transistor structure B does not include an air-gap over it. In FIG. 14, like in FIG. 11, air-gaps 140 are formed on both transistor structures A and B; however, the wiring layout of second metallization layer 155 and third metallization layer 160 is different from the ones shown in FIG. 11. In FIG. 15, both transistor structures A and B have an air-gap 140 extending through third metallization layer 160, second metallization layer 155, first metallization layer 135, and ILD 145. Finally, FIG. 16 is a cross-sectional view of two chip areas K and R with similar transistor structures A and B. In some embodiments, chip area K is substantially similar to first chip area A' discussed above where height H1 of source/drain contacts 125 is configured, for example, to be greater than height H2 and equal to or less than about 2.5 times height H2. Further, an air-gap 140 is formed over transistor structure A. In contrast, in chip area R source/drain contacts 125' are taller than about 2.5 times height H2 and there is no air-gap over transistor structure B. By way of example and not limitation, transistor structure A within chip area K is part of an RF circuit that is sensitive to RC delays and therefore shorter source/drain contacts 125 and air-gaps 140 can reduce the RC delays. On the other hand, structure B in chip area R is part of a circuit that is less sensitive to RC delays. In some embodiments, chip areas K and R can be adjacent to each other separated by an isolation region 1600 or separated by other areas of the chip. The example of FIG. 16 demonstrates that method 400 can be applied in selected portions/areas of the chip to alleviate issues related to RC delays.

In addition to the above, different permutations of the embodiments described in FIGS. 1-3 and 11-16 are possible and are within the spirit and the scope of this disclosure.

The embodiments described herein are directed to a method for reducing the RC delay in RF devices or other devices that would benefit from an RC delay reduction. In some embodiments, the method includes forming local interconnects, such as source/drain and gate contacts, with reduced height and introducing air-gaps between the aforementioned contacts and the BE metallization layers to reduce the parasitic capacitances. The embodiments described herein can be implemented globally (e.g., applied to all the areas of the chip) or selectively (e.g., applied on selective areas of the chip). In some embodiments, the portion of the air-gap formed between the local interconnects occupies between about 30% and about 70% of the available volume and the portion of the air-gap formed above the transistor level (e.g., within the first metallization layer in BE) occupies between about 40% and about 90% of the available volume. In some embodiments, air-gaps are formed at the transistor level (e.g., in the ILD of the local interconnects), above the transistor level (e.g., in the IMD of the metallization layers), or in combinations thereof. In further embodiments, the source/drain contacts are taller than the height of the transistor's gate structure but no taller than about 2.5 times the height of the transistor's gate structure including any intervening silicide layers if any. In some embodiments, the height of the gate contact is reduced to improve the contact resistance and is configured to range between about 0.25 times and about 1.5 times the height of the transistor's gate structure (including any intervening silicide layers on the transistor's structure). In some embodiments, the combination of contact height reduction in local interconnects and the presence of air-gaps as described herein achieves RC delay reduction in the circuit.

In some embodiments, a structure includes a substrate with a first transistor and a second transistor formed thereon where the first and second transistors have an equal height and each includes source/drain regions and a gate structure. The structure further includes a local interconnect layer comprising source/drain contacts and gate contacts respectively connected to the source/drain regions and the gate structure of the first and second transistors, where the source/drain contacts are taller than the gate structures of the first and second transistors. The structure also includes a first interconnect layer on the local interconnect layer with metal lines connected to the source/drain contacts and the gate contacts of the local interconnect layer and an air-gap extending into the local interconnect layer and the first interconnect layer.

In some embodiments, a structure includes a substrate with a transistor structure formed thereon, where the transistor structure includes source/drain regions and a gate structure; a local interconnect layer with source/drain contacts connected to the source/drain regions of the transistor structure; a first interconnect layer disposed on the local interconnect layer with metal lines connected to the source/drain contacts of the local interconnect layer; and an air-gap in the first interconnect layer, where the air-gap is positioned above the transistor structure and extends between neighboring metal lines of the first interconnect layer.

In some embodiments, a method includes forming a transistor structure on a substrate, where the transistor structure includes source/drain regions disposed in the substrate and a gate structure; depositing a first dielectric layer on the substrate to embed the transistor structure; forming, within the first dielectric layer, source/drain contacts on the source/drain regions of the transistor structure; depositing a second dielectric layer on the first dielectric layer; forming metal lines in the second dielectric layer to connect to the source/drain contacts; forming an opening in the second dielectric layer between the metal lines to expose the first dielectric layer; etching, through the opening, the second dielectric layer between the metal lines and the first dielectric layer between the source/drain contacts to form an extended opening; and depositing a third dielectric layer to seal the extended opening and to form an air-gap in the first and second dielectric layers and over the transistor structure.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first dielectric layer over a transistor;
    forming a second dielectric layer on the first dielectric layer;
    forming a contact structure through the first and second dielectric layers, wherein the contact structure is in contact with the transistor;
    forming a first cavity in the first dielectric layer and adjacent to the contact structure;
    forming a second cavity in the second dielectric layer and above the first cavity; and
    forming a liner on a first inner surface of the first cavity and on a second inner surface of the second cavity.

2. The method of claim 1, wherein forming the contact structure comprises:
    forming a first conductive structure on a source/drain region of the transistor and in the first dielectric layer; and
    forming a second conductive structure on the first conductive structure and in the second dielectric layer.

3. The method of claim 1, further comprising forming, before forming the second dielectric layer, an etch stop layer on the first dielectric layer.

4. The method of claim 3, wherein forming the second cavity comprises forming an opening through the etch stop layer and connecting the first and second cavities.

5. The method of claim 3, wherein forming the liner comprises depositing the liner on an upper surface and a lower surface of the etch stop layer.

6. The method of claim 1, wherein forming the first cavity comprises removing a portion of the first dielectric layer above a gate structure of the transistor.

7. The method of claim 1, wherein forming the first cavity comprises forming curved internal surfaces of the first cavity.

8. A method, comprising:
    forming a first dielectric layer over a transistor;
    forming an etch stop layer on the first dielectric layer;
    forming a second dielectric layer on the etch stop layer;
    forming a contact structure through the first and second dielectric layers and the etch stop layer, wherein the contact structure is in contact with a source/drain region of the transistor;
    forming an air gap adjacent to the contact structure and in the first and second dielectric layers; and
    forming a liner in the air gap, wherein the liner is in contact with a top surface of the air gap.

9. The method of claim 8, wherein forming the air gap comprises forming rounded corners of the air gap.

10. The method of claim 8, wherein forming the air gap comprises:
forming a first cavity in the first dielectric layer;
forming a second cavity in the second dielectric layer; and
forming an opening through the etch stop layer and connecting the first and second cavities.

11. The method of claim 8, wherein forming the air gap comprises forming the air gap above a gate structure of the transistor.

12. The method of claim 8, wherein forming the liner comprises depositing the liner on an upper surface and a lower surface of the etch stop layer.

13. The method of claim 8, wherein forming the liner comprises depositing the liner on a slanted surface of the air gap.

14. The method of claim 8, wherein forming the liner comprises depositing the liner on a convex bottom surface of the air gap.

15. A method, comprising:
forming a dielectric layer over a transistor;
forming a contact structure through the dielectric layer and in contact with a source/drain region of the transistor;
forming a first cavity in the dielectric layer and adjacent to the contact structure;
forming a second cavity under the first cavity and connected to the first cavity through an opening; and
reducing a size of the opening.

16. The method of claim 15, wherein reducing the size of the opening comprises forming a liner on inner surfaces of the first and second cavities.

17. The method of claim 15, wherein forming the dielectric layer comprises forming an etch stop layer between the first and second cavities.

18. The method of claim 17, wherein forming the second cavity comprises forming the opening through the etch stop layer.

19. The method of claim 15, further comprising forming a liner on inner surfaces of the first and second cavities.

20. The method of claim 15, further comprising forming an other contact structure through the dielectric layer and in contact with a gate structure of the transistor, wherein forming the first cavity comprises removing a portion of the dielectric layer above the gate structure and away from the other contact structure.

* * * * *